US007518291B2

(12) United States Patent
Tanaya

(10) Patent No.: US 7,518,291 B2
(45) Date of Patent: Apr. 14, 2009

(54) PIEZOELECTRIC DEVICE

(75) Inventor: Hideo Tanaya, Suwa (JP)

(73) Assignee: Epson Toyocom Corporation (JP)

( * ) Notice: Subject to any disclaimer, the term of this patent is extended or adjusted under 35 U.S.C. 154(b) by 0 days.

(21) Appl. No.: 11/726,665

(22) Filed: Mar. 22, 2007

(65) Prior Publication Data

US 2007/0228891 A1  Oct. 4, 2007

(30) Foreign Application Priority Data

Mar. 22, 2006 (JP) ............................. 2006-078888

(51) Int. Cl.
*H01L 41/08* (2006.01)
(52) U.S. Cl. ..................... 310/348; 310/361; 310/370
(58) Field of Classification Search ................. 310/340, 310/344, 346, 348, 370
See application file for complete search history.

(56) References Cited

U.S. PATENT DOCUMENTS

| 6,590,315 | B2 * | 7/2003 | Beaver ....................... 310/348 |
| 7,067,966 | B2 * | 6/2006 | Tanaya ....................... 310/367 |
| 2007/0170819 | A1 * | 7/2007 | Kuwahara .................. 310/344 |
| 2008/0211350 | A1 * | 9/2008 | Tanaya et al. .............. 310/328 |

FOREIGN PATENT DOCUMENTS

| JP | 62-22712 | 5/1987 |
| JP | 2000-068780 | 3/2000 |
| JP | 2002-261575 | 9/2002 |
| JP | 2005-311298 | 11/2005 |
| WO | WO 00/76066 | 12/2000 |

* cited by examiner

*Primary Examiner*—Thomas M Dougherty
(74) *Attorney, Agent, or Firm*—Baker Hostetler, LLP

(57) ABSTRACT

[Problem to be Solved]

A piezoelectric device is provided in which, when the piezoelectric device is miniaturized, drive level characteristics are favorable, stress does not remain in a bonding portion of a housing body, and a factor causing deterioration of characteristics does not remain.

[Solution]

A piezoelectric device includes a base substrate 54, a resonator element 55 with a frame, and a lid 56 layered over and fixed to the resonator element with a frame, in which the base substrate, the resonator element with a frame, and the lid are all formed from a same material. The resonator element 55 with a frame includes a resonator element main body 32 and a frame section 53. Each bonding surface bonding the base substrate, the resonator element with a frame, and the lid is bonded by surface activation bonding and hermetically sealed. An electrode for driving of the resonator element main body 32 is routed to the frame section as an extraction electrode. As a result of bonding, the extraction electrode of the frame section is electrically connected to a mounting electrode serving as an external terminal provided on the base substrate, via a conductive pattern formed on the bonding surface of the base substrate.

8 Claims, 10 Drawing Sheets

PIEZOELECTRIC DEVICE

TECHNICAL FIELD

The present invention relates to improvements made to a piezoelectric resonator element and a piezoelectric device in which the piezoelectric resonator element is housed within a package or a case.

BACKGROUND ART

A piezoelectric device, such as a piezoelectric resonator and a piezoelectric oscillator, is widely used in compact information-processing devices, mobile communication devices, piezoelectric gyro sensors, and the like. A compact information-processing device is, for example, a hard disk drive (HDD), a portable computer, or an integrated circuit (IC) card. A mobile communication device is, for example, a mobile phone, a car phone, or a paging system.

FIG. 14 is a schematic planar view of an example of the piezoelectric resonator element that has been used in the piezoelectric device.

With reference to the diagram, an outer shape of a piezoelectric resonator element 1 shown in the diagram is formed by a piezoelectric material being etched. The piezoelectric material is, for example, quartz crystal. The piezoelectric resonator element 1 includes a rectangular base section 2 and a pair of resonating arms 3 and 4. The base section 2 is attached to a package (not shown) or the like. The resonating arms 3 and 4 extend upward from the base section 2, with reference to the diagram. Long grooves 3a and 4a are formed on main surfaces (front and back surfaces) of the resonating arms. A required electrode for driving is also formed on the main surfaces of the resonating arms (refer to Patent Document 1).

In the piezoelectric resonator element 1, such as that described above, a signal of a predetermined frequency is extracted when driving voltage is applied via the electrode for driving, as a result of flexural vibration. In flexural vibration, respective tips of the resonating arms 3 and 4 draw close to and away from each other.

An extraction electrode is formed on such piezoelectric resonator element 1 in areas of the base section 2 indicated by reference numerals 5 and 6. Adhesives 7 and 8 are applied to the areas. The areas are bonded and fixed to, for example, an inner bottom surface of a rectangular, box-shaped, ceramic package. Thus, the extraction electrode is housed therein.

After the piezoelectric resonator element 1 is bonded and fixed using the adhesives, cut portions 9 and 9 are formed on the base section 2 so that residual stress does not interfere with the flexural vibration of the resonating arm. The residual stress remains due to, for example, a difference in coefficients of linear expansion between a material forming the piezoelectric resonator element and a material forming the package and the like.

[Patent Document 1] JP-A-2002-261575
[Patent Document 2] JP-A-2000-68780

DISCLOSURE OF THE INVENTION

[Problem to be Solved by Invention]

In such piezoelectric resonator element 1, as a result of size reduction, arm widths W1 and W1 of the resonating arms 3 and 4 of are respectively about 100 micrometers. A distance MW1 between the resonating arms 3 and 4 is about 100 micrometers. A width BW1 of the base section 2 is about 500 micrometers. The size of the piezoelectric resonator element 1 is further reduced as a result of the above-described portions being shortened and a length BL1 of the base section also being shortened in correspondence thereto.

In such compact piezoelectric resonator element 1, it is becoming difficult to bond the very small piezoelectric resonator element 1 to the ceramic package without problems. A problem is, for example, the tip of the resonator arm dropping and coming into contact with the bottom surface.

Because the areas of the base section 2 indicated by the reference numerals 5 and 6 are fixed, the bonded piezoelectric resonator element 1 is easily damaged by impact from the piezoelectric device falling. If the amounts of the adhesives 7 and 8 applied to the base section 2 are increased to keep damage from the impact to a minimum, the flexural vibration of the resonator arms may be obstructed. A crystal impedance (CI) value may rise, and drive characteristics may deteriorate.

A method such as that disclosed in Patent Document 2 is known as a method for preventing such a situation.

Patent Document 2 was disclosed before Patent Document 1. In Patent Document 2, a following technology is disclosed (refer to FIG. 1 and FIG. 2 of Patent Document 2). A quartz crystal resonator element 60 is layered over a glass case 70. The glass case 70 has a recess. An outer frame 50 is integrally formed on the quartz crystal resonator element 60. A glass lid 10 is further layered over the quartz crystal resonator element 60. The case 50, the quartz crystal resonator element 60, and the lid 10 are anodically bonded (refer to FIG. 1 and FIG. 2 of Patent Document 2).

Because Patent Document 2 uses anodic bonding technology, a quartz crystal resonator with a frame is sandwiched between glasses made from a different material. Because materials having differing coefficients of thermal expansion are bonded, stress remains in bonding portions. The stress causes deterioration of characteristics.

Because bonding is performed under heat in anodic bonding, gas is generated during bonding. Therefore, the interior of the case cannot be a high-vacuum environment. The piezoelectric resonator element is excited and the CI value increases, thereby causing the deterioration of the characteristics.

The present invention has been achieved to solve the above-described problems. An advantage of the invention is to provide a piezoelectric device in which, when the piezoelectric device is miniaturized, drive level characteristics are favorable, stress does not remain in a bonding portion of a housing body, an interior of a case can be a high-vacuum environment, and a factor causing deterioration of characteristics does not remain.

[Means for Solving Problem]

The above-described advantage is achieved as follows. A piezoelectric device according to a first aspect of the invention includes a base substrate, a resonator element with a frame, and a lid. The resonator element with a frame is layered over and fixed to the base substrate. The lid is layered over and fixed to the resonator element with a frame. The base substrate, the resonator element with a frame, and the lid are all formed from a same material. Alternatively, the base substrate, the resonator element with a frame, and the lid are formed from materials having very similar coefficients of linear expansion. The resonator element with a frame includes a resonator element main body and a frame section. The resonator element main body is a piezoelectric resonator element section. The frame is formed so as to surround the periphery of the resonator element main body. Each bonding surface bonding the base substrate, the resonator element with a frame, and the lid is bonded by surface activation bonding. As a result, the bonding surface is hermetically sealed. Moreover, an electrode for driving formed on the resonator element main body is routed to the frame section as an extraction electrode. As a result of bonding, the extraction electrode of the frame section is electrically connected to a mounting electrode, via a conductive pattern formed on a bonding surface of the base substrate. The mounting electrode is provided on the base substrate and serves as an external terminal.

In the configuration according to the first aspect, the piezoelectric device of the invention has a structure in which a package housing the piezoelectric resonator element is formed from the base substrate and the frame section of the resonator element with a frame layered over the base substrate. The lid is layered over the package and heremetically seals the package.

Therefore, the piezoelectric element is not required to be fixed to the package using adhesive or the like because the piezoelectric resonator element is formed integrally with the frame section. Bonding is not difficult, even when the piezoelectric element is formed compactly.

The base substrate, the resonator element with a frame layered over and fixed to the base substrate, and the lid layered over and fixed to the resonator element with a frame are formed from the same material or from materials having very similar coefficients of linear expansion. Therefore, even when the base substrate, the resonator element with a frame, and the lid are bonded in a layered state, stress caused by a change in thermal environment is not applied to a bonding portion The base substrate, the resonator element with a frame, and the lid can be suitably bonded even when the materials thereof are the same by, for example, plasma being irradiated onto each bonding surface of the base substrate, the resonator element with a frame, and the lid, thereby activating a front surface of the bonding surface (surface activation bonding). Gas, such as that generated in anodic bonding, is not generated during bonding.

Because "an electrode for driving formed on the resonator element main body is routed to the frame section as an extraction electrode. As a result of bonding, the extraction electrode of the frame section is electrically connected to a mounting electrode, via a conductive pattern formed on a bonding surface of the base substrate. The mounting electrode is provided on the base substrate and serves as an external terminal.", an operation related to an electrical connection to transmit driving voltage to the piezoelectric resonator element is not required to be performed when the base substrate and the resonator element with a frame are being bonded.

Therefore, the piezoelectric device can be provided in which, when the piezoelectric device is miniaturized, the drive level characteristics are favorable, stress does not remain in the bonding portion of the housing body, the interior of a case can be a high-vacuum environment, and a factor causing deterioration of characteristics does not remain because the gas is not generated during bonding.

The piezoelectric device according to a second aspect of the invention is the configuration according to the first aspect, in which the base substrate, the resonator element with a frame, and the lid are all formed from quartz crystal having a same cut angle.

In the configuration according to the second aspect, as a result of the resonator element with a frame being formed from the quartz crystal having a predetermined cut angle, by piezoelectric effect thereof, a piezoelectric resonator element achieving suitable piezoelectric action can be obtained. As a result of the lid and the base substrate being formed from the quartz crystal having the same cut angle as the resonator element with a frame, various characteristics, such as the coefficient of linear expansion regarding heat, match. When the base substrate, the resonator element with a frame, and the lid are bonded, favorable characteristics can be obtained, such as distortion caused by excessive stress not remaining.

The piezoelectric device according to a third aspect of the invention is the configuration according to the first aspect or the second aspect, in which the resonator element main body that is the piezoelectric resonator element section includes a base section and a plurality of resonating arms. The base section extends from an inner side of an edge forming the frame section, within the frame section. The resonating arms extend from the base section. Long grooves are provided on the plurality of resonating arms. A long groove is formed along a length direction of a main surface of a resonating arm and includes a driving electrode therewithin. A width dimension of each resonating arm has a narrowing width portion in which width gradually narrows, from the base section side toward a tip side. A changing point P of width change is provided at the tip side. In width change, the width dimension extends toward the tip side by an equal dimension or begins to increase. The changing point P is positioned closer to the tip side of the resonating arm than a tip side of a long groove.

According to the third aspect, electrical field efficiency is enhanced when an electrode for driving (excitation electrode) is formed in the long groove formed on the resonating arm. When the long groove is formed, arm width gradually narrows from the base side toward the tip side. In addition, the changing point P of the width change in which the width dimension begins to increases is provided on the tip side. As a result, second-order harmonic wave oscillation can be prevented, while suppressing a CI value.

The piezoelectric device according to a fourth aspect of the invention is the configuration according to the third aspect in which the width dimension of each resonating arm includes a first narrowing width portion and a second narrowing width portion. The first narrowing width portion suddenly narrows toward the tip side at a base of the resonating arm to the base section. The second narrowing width portion gradually narrows from the end of the first narrowing width portion further toward the tip side, as the narrowing width portion.

In the configuration according to the fourth aspect, the second narrowing width portion is provided that gradually narrows the arm width of the resonating arm from the end of the first narrowing width portion further toward the tip side. In addition, the changing point P of the width change in which the width dimension begins to increases is provided on the tip side. As a result, the second-order harmonic wave oscillation can be prevented, while suppressing the CI value.

Moreover, the first narrowing width portion that suddenly narrows toward the tip side is provided at the base of the resonating arm to the base section. Therefore, rigidity of the base area can be enhanced. In the base area, maximum stress is applied there to and distortion increases when the resonating arm flexurally vibrates. As a result, flexural vibration of the resonating arm is stabilized and vibrational component in an unnecessary direction can be suppressed. Thus, the CI value can be further reduced. In other words, when the piezoelectric resonator element is miniaturized, stable flexural vibration can be realized and the CI value can be kept low.

The piezoelectric device according to a fifth aspect of the invention is the configuration according to the third aspect or the fourth aspect, in which the base section includes a cut portion formed with a narrowing width in a width direction.

In the configuration according to the fifth aspect, as a result of the cut portion being formed with a narrowing width in the width direction on a portion of a side edge of the base section, vibration leakage caused by the flexural vibration of the resonating arm can be prevented from reaching the frame section via the base section. A rise in the CI value can be prevented or can be prevented with further certainty.

The piezoelectric device according to the sixth aspect of the invention is the configuration according to the fifth aspect, in which the cut portion is formed on the base section separated from the base of each resonator arm by a distance equal to or more than 1.2 times the arm width dimension.

In the configuration according to the sixth aspect, in light of a correlation with an arm width dimension W2 of the resonator arm, regarding a range over which vibration leakage is transmitted when the resonating arm of a tuning-fork-type resonator element flexurally vibrates, a position at which the cut portion is provided is a position exceeding the arm width dimension W2 of the resonator arm from the base of the resonator arm. As a result, a structure can be achieved in which the cut portion can suppress the transmission of vibration leakage from the resonating arm to the base section side with further certainty. As a result, leakage of the vibration from the resonating arm side to the base section side can be appropriately prevented, and a piezoelectric device having favorable drive level characteristics can be provided.

The piezoelectric device according to a seventh aspect of the invention is the configuration according to any one of the third aspect to the sixth aspect, in which a through hole is provided at a position in the base section closer to the resonating arm than an area at which the frame section is integrally connected to the base section.

In the configuration according to the seventh aspect, the through hole is provided at the position in the base section closer to the resonating arm than a connecting portion at which the frame section is integrally connected to the base section. Compared to the cut portion being formed on the side edge of the base station in place of the through hole, vibration leakage can be further suppressed without significantly reducing the rigidity of the base section.

The piezoelectric device according to an eighth aspect of the invention is the configuration according to any one of the third aspect to the seventh aspect, in which an irregular-shaped portion projecting toward a positive X axis (electrical axis) direction is formed on a side surface of each resonator arm with a size equal to or less than five micrometers.

In the configuration according to the eighth aspect, if the irregular-shaped portion formed as a result of etching anisotropy is formed to a minimum size, equal to or less than five micrometers, when wet-etching is performed to form an outline of the piezoelectric resonator element, the flexural vibration of the resonating arm can be stabilized.

The piezoelectric device according to a ninth aspect of the invention is the configuration according to any one of the third aspect to the eighth aspect, in which a center position of a width dimension of the long groove of each resonator arm is de-centered in a negative X axis direction from a center position of the arm width dimension.

In the configuration according to the ninth aspect, in a process for forming the resonator element with a frame, as a result of the etching anisotropy thereof, thicknesses of wall portions provided in the resonating arm to sandwich the long groove from both sides differ. The thickness on the negative X axis side is thicker. Therefore, the center position of the width dimension of the long groove does not pass through a center of gravity position of the resonating arm in the width direction in a traditional forming position. As a result, the flexural vibration of the resonating arm is obstructed.

Because center position of the width dimension of the long groove being de-centered in the negative X axis direction or, in other words, the center position of the width dimension of the long groove being shifted in the negative X axis direction, the center position of the width dimension of the long groove is closer to the center of gravity position of the resonating arm in the width direction. Thus, weight balance between the left and right of the resonating arm can be adjusted. As a result, even when the piezoelectric resonator element is miniaturized, groove width of the long groove is reduced, and a fin is made smaller, stable flexural vibration of the resonating arm can be actualized and a piezoelectric device with superior drive characteristics can be provided.

The above-described object is achieved by a method of manufacturing a piezoelectric device according to a tenth aspect of the invention. The method includes forming a base substrate layer including the base substrate, a device layer including the piezoelectric element with a frame, and the lid layer including the lid and performing surface activation on each bonding surface of the base substrate layer, the device layer, and the lid layer. Each layer is formed from the same material or materials having very similar coefficients of linear expansion. Each layer is of a size equivalent to a plurality of products of the same number. The method also includes bonding by layering and pressing each layer. The method also includes, after layering and fixing, cutting the layers into the size of each product.

According to the tenth aspect, the base substrate layer, the device layer including the piezoelectric element with a frame layered and fixed to the base substrate, and the lid layer bonded to the device layer are formed from the same material or materials having very similar coefficients of linear expansion. Therefore, even when the base substrate layer, the device layer, and the lid layer are bonded in the layered state, stress caused by the change in thermal environment is not applied to the bonding portion.

Moreover, plasma or the like is irradiated onto each bonding surface of the base substrate layer, the device layer, and the lid layer in advance, thereby activating the front surface of the bonding surface. Thus, a structure is actualized in which even the same materials are appropriately bonded. As a result of cutting being performed by post-bonding dicing or the like, the piezoelectric device can be efficiently produced. Furthermore, when the piezoelectric device is miniaturized, a manufacturing method can be provided in which the drive level characteristics are favorable, stress does not remain in the bonding portion of the housing body, and a factor causing deterioration of characteristics does not remain.

The method according to an eleventh aspect of the invention is the method according to the tenth aspect, in which layering and pressing are performed under vacuum and hermetic sealing is performed.

In the method according to the eleventh aspect, the layers are pressed and bonded under vacuum, and the interior of the package or the case is vacuum-sealed with high precision. As a result, because vibration performance of the housed piezoelectric resonator element is not degraded, a CI (crystal impedance) value with a low practical level can be achieved.

The method according to a twelfth aspect is the method according to the tenth aspect, in which layering and pressing are performed under atmosphere and hermetic sealing is performed by a hole-sealing being performed under vacuum.

In the method according to the twelfth aspect, if pressing and bonding can be performed under atmosphere, a facility for pressing and bonding is simplified and performance is facilitated because a vacuum device is not used. As a result of the hole being sealed under vacuum, the interior of the package or the case can be hermetically sealed with a higher degree of vacuum.

The method according to a thirteenth aspect is the method according to one of the tenth aspect to the twelfth aspect, in which plasma irradiation onto the bonding surface is performed under vacuum on a bonding surface between the device layer and the base substrate layer or the device layer and the lid layer in advance, under vacuum. The layers are aligned under atmosphere. After bonding is performed, plasma is irradiated under vacuum onto a bonding surface with a remaining layer. The layers are aligned under atmosphere, and bonding is subsequently performed under vacuum.

In the configuration according to the thirteenth aspect, plasma irradiation and bonding can be completely separated. Compared to a method using the same device to consecutively perform the above-described processes, device-scale can be small. Therefore, efficient production can be achieved if devices appropriate for performance of respective processes are provided.

EXPLANATIONS OF LETTERS OR NUMERALS

Figure 1:
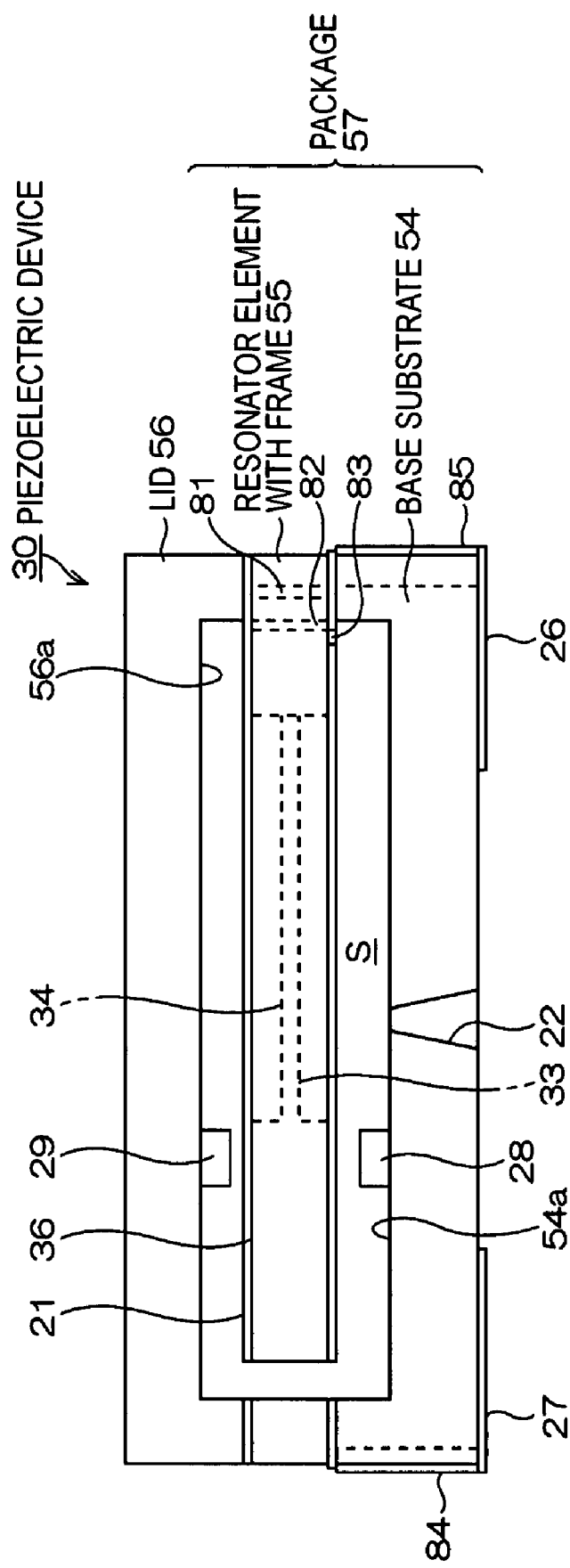
FIG. 1 is a schematic cross-sectional diagram of a piezoelectric device according to an embodiment of the present invention.

30 Piezoelectric device
32 Resonator element main body
33 and 34 Long groove
35 and 36 Resonating arm
53 Frame section
54 Base substrate
55 Resonator element with a frame
56 Lid
71 and 72 Cut portion
80 Through-hole

BEST MODE(S) OF CARRYING OUT THE INVENTION

FIG. 1 shows a piezoelectric device according to an embodiment of the present embodiment. FIG. 1 is a schematic vertical cross-sectional diagram thereof.

In the diagram, an example in which a piezoelectric device 30 includes a piezoelectric resonator is shown. The piezoelectric device 30 houses a piezoelectric resonator element within a package 57.

Specifically, the piezoelectric device 30 includes a base substrate 54, a resonating element 55 with a frame, and a lid 56. The base substrate 54 is an insulating base. The resonating element 55 with a frame is layered over and fixed to the base substrate 54. The lid 56 is layered over and fixed to the resonating element 55 with a frame.

The package 57 in the piezoelectric device 30 hermetically houses the piezoelectric resonator element. The package 57 includes the base substrate 54, a frame section of the resonating element 55 with a frame, and the lid 56. The base substrate 54, the frame section of the resonating element 55 with a frame, and the lid 56 have matching outer appearances.

The base substrate 54 is an insulating base formed from an insulating material, described hereafter. The base substrate 54 forms a bottom portion of the package 57.

The resonator element 55 with a frame is made from a piezoelectric material. According to the embodiment, quartz crystal is used as the piezoelectric material forming the resonator element 55 with a frame. Other than quarts crystal, piezoelectric materials such as lithium tantalate and lithium niobate can be used. According to the embodiment, a wafer made from a quartz crystal Z plate is particularly used. A cut angle of the quartz crystal will be described in detail, hereafter.

Figure 2A:
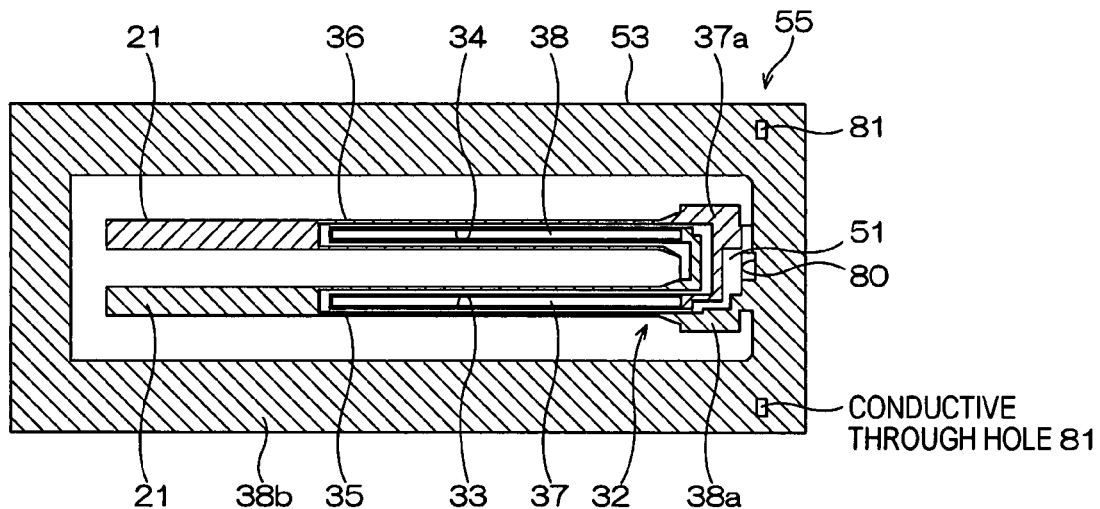
FIG. 2 is a diagram of a resonator element with a frame.
Figure 2B:
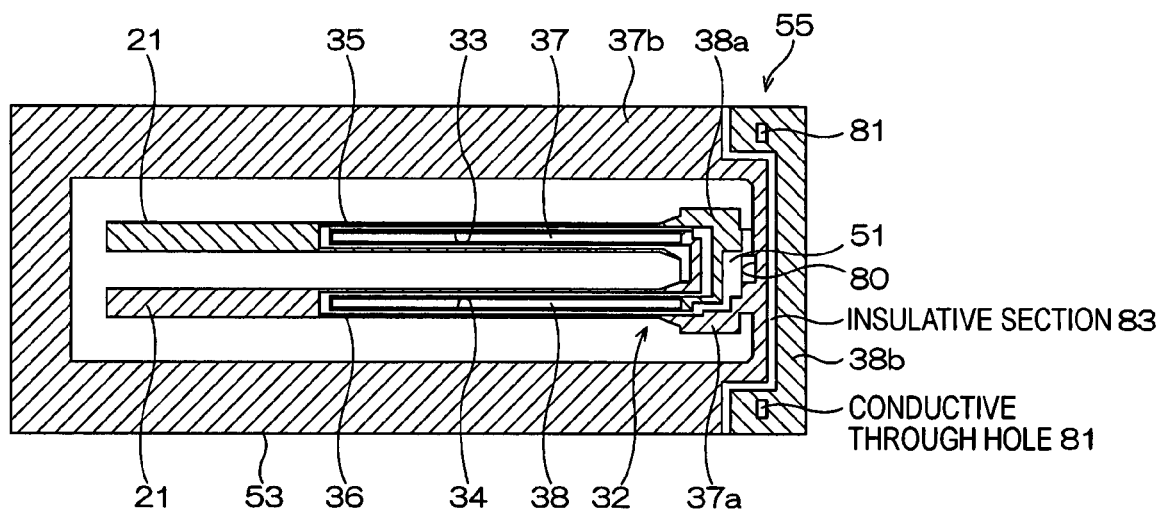

FIG. 2A is a schematic planar view of the resonator element 55 with a frame. FIG. 2B is a schematic bottom view (back view) of the resonator element 55 with a frame.

With reference to the diagrams, the resonator element 55 with a frame according to the embodiment includes, for example, a rectangular frame section 53, a base section 51, and a pair of resonating arms 35 and 36. The frame section 53 is long in one direction. The base section 51 integrally extends inwardly from one edge of the frame section 53, within the frame section 53. The resonating arms 35 and 36 extend in parallel from the base section 51 to the left, with reference to the diagrams.

A long groove, for example, is formed on each resonating arm. Within the long groove, an excitation electrode serving as a driving electrode is formed within the long groove. The excitation electrode within each long groove forms a pair with each other. Excitation electrodes mutually function as heteropolar electrodes and efficiently form an electrical field within a resonator element main body 32. Metal coatings 21 and 21 are formed on a tip side of each resonating arm 35 and 36. The metal coatings 21 and 21 serve as an anchor for frequency adjustment (fine adjustment), described hereafter.

The lid 56 is a lid. As described hereafter, the lid 56 is fixed to the resonator element 55 with a frame and hermetically seals a space housing the resonator element main body 32.

According particularly to the embodiment, a material transmitting light used for frequency adjustment (such as a laser beam) is preferably selected for the lid 56. A transparent material is ideal. The lid 56 is preferably formed as described hereafter from, for example, the quartz crystal Z plate, because the lid 56 can be formed from the same material as the resonator element 55 with a frame, serving as a bonding subject, and coefficients of linear expansion are the same.

Alternatively, for example, a high-expansion glass or a high-expansion glass-ceramic can be used. The base substrate 54 can also be made using the same material.

A recess 56a and a buffer projection 29 are provided on the lid 56, as shown in FIG. 1. The recess 56a is formed on the inner side of the lid 56. The buffer projection 29 projects inward (downward) from the recess 56a. The recess 56a is formed over an entire inner side of the lid 56, forming an upper portion of an internal space S in the package 57. To prevent the resonator element main body 32 from colliding with an inner surface of the lid 56 and damaging the lid 56 when the resonator element main body 32 swings upward as a result of external impact or the like, the buffer projection 29 stops the large swinging.

Figure 5:
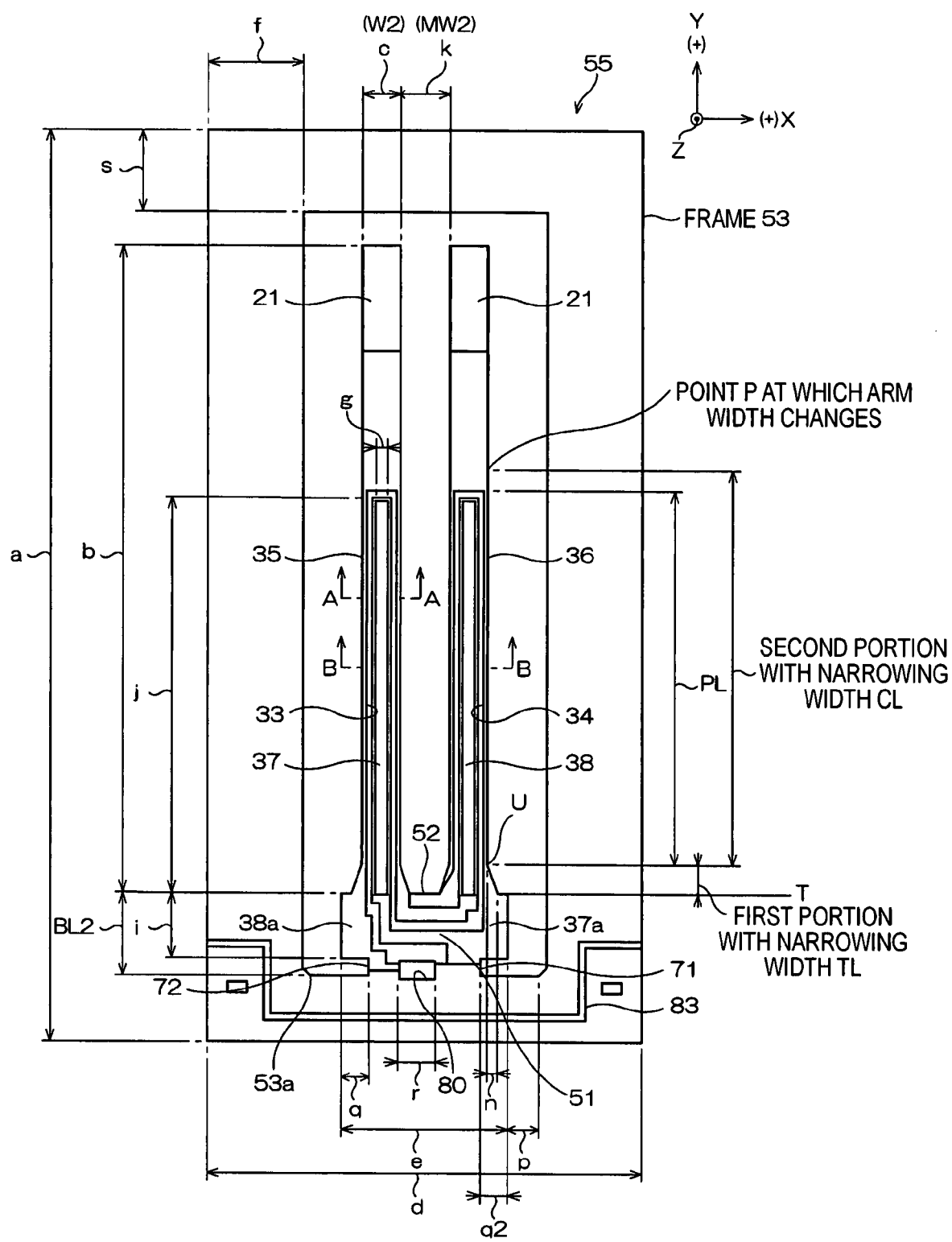
FIG. 5 is a detailed schematic planar view of the resonator element with a frame in FIG. 2.
Figure 6:
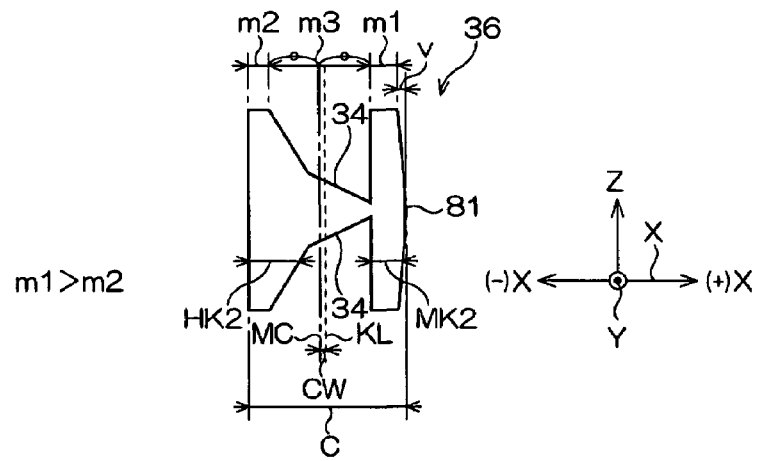
FIG. 6 is a cross-sectional diagram of a resonating arm portion, taken along line A-A in FIG. 5.
Figure 7:
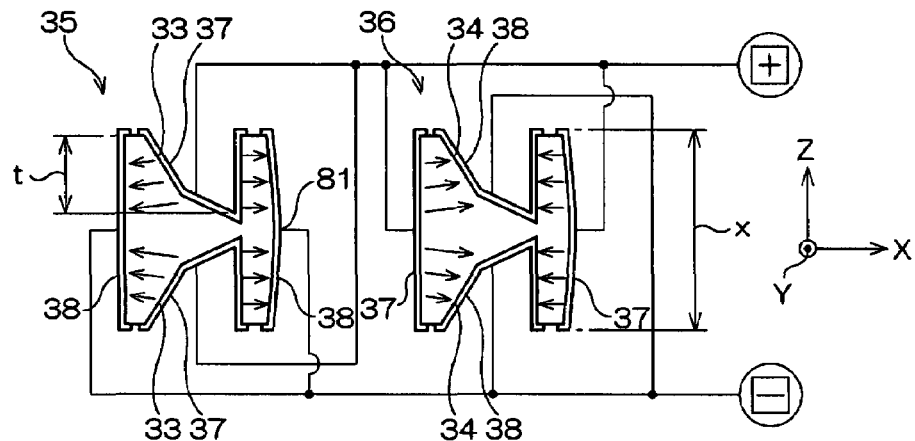
FIG. 7 is a cross-sectional diagram taken along line B-B in FIG. 5.

A detailed planar view of the above-described resonator element 55 with a frame is shown in FIG. 5. FIG. 6 is a cross-sectional diagram taken along line A-A in FIG. 5. FIG. 7 is a cross-sectional diagram taken along line B-B in FIG. 5.

With reference to the diagrams, the resonator element main body 32 will be described. The resonator element main body 32 particularly forms a piezoelectric resonator element section of the resonator element 55 with a frame.

As shown in FIG. 5, the resonator element main body 32 includes the base section 51 and the pair of resonating arms 35 and 36. The resonating arms 35 and 36 separate into two and extend upward in parallel from one end (upper end with reference to FIG. 5) of the base section 51.

Preferably, long grooves 33 and 34 are respectively formed on the front and back of a main surface of each resonating arm 35 and 36. The long grooves 33 and 34 extend in the length direction. As shown in FIG. 7, excitation electrodes 37 and 38 serving as electrodes for driving are provided within the long grooves.

Preferably, a tip of each resonating arm 35 and 36 is tapered, gradually growing wider. As a result, weight of the tip is increased, and the tip can serve as an anchor. Thus, flexural vibration of the resonating arm is facilitated.

Such resonator element 55 with a frame including the outer tuning-fork shape of the resonator element main body 32 and the long groove formed on each resonating arm are respectively formed with precision by wet-etching or dry-etching being performed on a material such as a quartz crystal wafer. The wet-etching is performed using hydrofluoric acid solution or the like.

As shown in FIG. 7, the excitation electrodes 37 and 38 are formed within the long grooves 33 and 34 and on a side surface of each resonating arm. The electrode within the long groove and the electrode provided on the side surface in each resonating arm form a pair. Each excitation electrode 37 and 38 are routed to the base section 51 and the frame section 53 as extraction electrodes 37a and 38a. Connection for transmitting driving voltage from an external source to the resonator element main body 32 when the piezoelectric device 30 is mounted on a mounting substrate or the like will be described in detail hereafter.

According to the embodiment, by a configuration described hereafter, the driving voltage is applied to the excitation electrodes within the long grooves 33 and 34. As a result, electrical field efficiency during driving can be enhanced within an area in which the long groove of each resonating arm is formed.

In this case, as shown in FIG. 7, each excitation electrode 37 and 38 is coupled to an alternating-current power supply by cross-wiring. Alternating voltage serving as the driving voltage is applied from the power supply to each resonating arm 35 and 36.

As a result, the resonating arms 35 and 36 are excited so as to vibrate inversely with each other. In basic mode or, in other words in a fundamental wave, the resonating arms 35 and 36 are flexurally vibrated so that the tip of each resonating arm 35 and 36 draws closer to and away from each other.

Here, for example, the fundamental wave of the resonator element main body 32 has a Q value of 12,000, a capacity ratio (C0/C1) of 260, a CI value of 57 kΩ, and a frequency of 32.768 kilohertz.

A second-order harmonic wave has, for example, a Q value of 28,000, a capacity ratio (C0/C1) of 5100, a CI value of 77 kΩ, and a frequency of 207 kilohertz.

As shown in FIG. 1, FIG. 2A and FIG. 2B, the excitation electrodes 37 and 38 are respectively routed to the base section 51 as the extraction electrodes 37a and 38a. The excitation electrodes 37 and 38 are electrodes for driving formed on the resonator element main body 32. Furthermore, as shown in FIG. 2A, the extraction electrode 38a of the base section 51 is routed to an entire front side of the rectangular frame section 53 as an extension section 38b. The front side of the frame section 53 is a bonding surface bonding with the lid 56.

On the other hand, as shown in FIG. 2B, the extraction electrode 37a of the base section 51 is routed around an entire back side of the rectangular frame section 53 as an extension section 37b. The back side of the frame section 53 is a bonding surface bonding with the base substrate 54.

However, as shown in FIG. 2B, the extension section 38b is formed routed around an outer edge of an edge of the frame section 53 on the base section 51 side and the periphery thereof. The extension section 38b is separated from the extension section 37b by an insulative section 83 provided so that a metal film is not formed. Furthermore, in a back side area of the extension section 38b, conductive through holes 81 and 81 are formed in the vicinity of the edges of the frame section 53 in the width direction. A conductive pattern 38b in FIG. 2A and a conductive patter 38b in FIG. 2B conduct power using the conductive through hole 81.

Figure 3A:
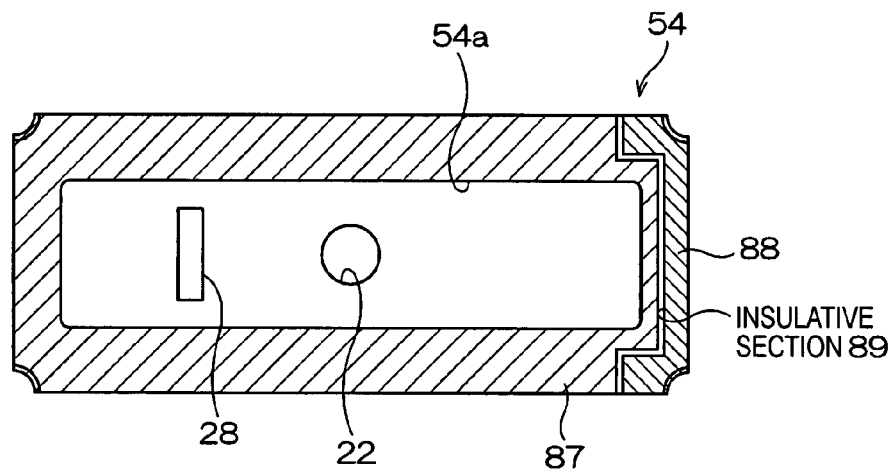
FIG. 3 is a diagram of a base substrate.
Figure 3B:
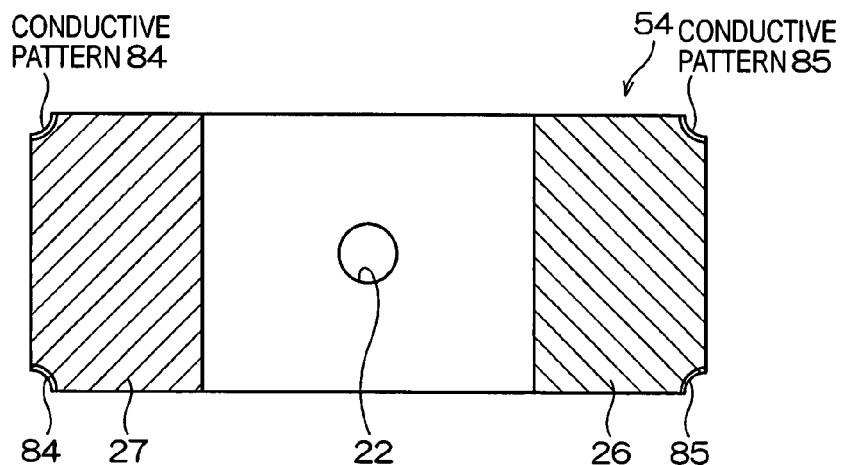

FIG. 3 shows a base substrate. FIG. 3A shows a schematic planar view of the base substrate 54. FIG. 3B shows a schematic bottom surface (back surface) view of the base substrate 54.

The base substrate 54 is shaped into a plate from the same material as the lid and the resonator element with a frame.

As shown in FIG. 3A and FIG. 1, a front surface of the base substrate 54 is an inner bottom surface of the package 57.

A recess 54a and a buffer projection 28 are formed on the base substrate 54, as shown in FIG. 1. The recess 54 is formed on the inner side of the base substrate 54. The buffer projection 28 projects inward (upward) from the recess 54a. As shown in FIG. 3A, the recess 54a is formed over the entire inner side of the base substrate 54, forming a lower portion of the internal space S in the package 57. To prevent the resonator element main body 32 from colliding with an inner surface of the base substrate 54 and damaging the base substrate 54 when the resonator element main body 32 swings downward as a result of external impact or the like, the buffer projection 28 stops the large swinging.

As shown in FIG. 3A, a conductive pattern 87 is formed around the recess 54a of the front surface of the base substrate 54. The area is the bonding surface bonding with a back surface of the resonator element 55 with a frame shown in FIG. 2B. On one edge among the edges of the base substrate 54 in the length direction, the conductive pattern 88 is formed. The conductive pattern 88 is separated from the conductive pattern 87 by the insulative section 89.

A castellation section is provided in the four corners of the base substrate 54. The castellation section is a quarter circle.

Conductive patterns 84, 84, 85, and 85 are provided on a front surface of the castellation section. The quarter-circle castellation section is based on a castellation that is a circular hole provided at an intersection of cutting-plane lines, when cutting is performed during a manufacturing process.

Figure 4:
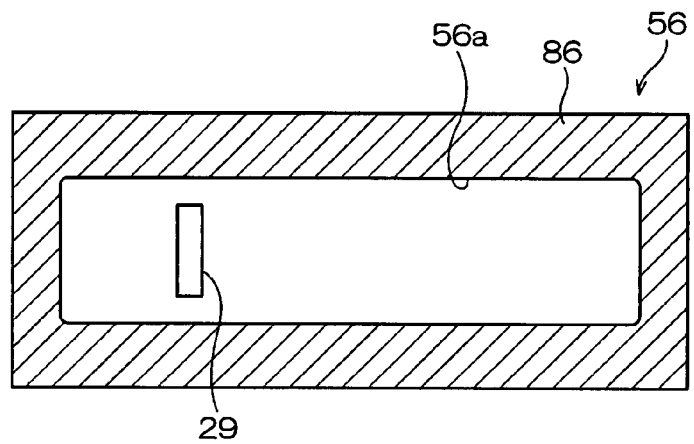
FIG. 4 is a diagram of a lid.

FIG. 4 shows a back surface of the lid 56.

As shown in FIG. 4, the recess 56a is formed in the center of the back surface of the lid 56. A periphery of the recess 56a remains, in the shape of a frame. The recess 56a is formed over an entire inner side of the lid 56, forming an upper portion of the internal space S in the package 57. A conductive pattern 86 is formed so as to surround the recess 56a. The surface on which the conductive pattern 86 is formed is the bonding surface bonding with the resonator element 55 with a frame.

As a result of a bonding process described hereafter, as shown in FIG. 1, the extension section 37b of a single extraction electrode 37a of the resonator element 55 with a frame is electrically connected with the conductive pattern 87 on the bonding surface of the base substrate 54 positioned on a lower side. The conductive pattern 87 is electrically connected to a mounting terminal 27 on a back surface, via the conductive pattern 84 on the castellation section described with reference to FIG. 3.

On the other hand, the extension section 38b of another extraction electrode 38a of the resonator element 55 with a frame is electrically connected to the conductive pattern 88 (see FIG. 3A) on an edge of the bonding surface of the base substrate 54 positioned on the lower side. The conductive pattern 88 is electrically connected to the mounting terminal 26 on the back surface via the conductive pattern 85 of the castellation section described with reference to FIG. 3.

In this way, each mounting terminal 26 and 27 is connected with each excitation electrode 37 and 38 in the resonator element main body 32 of the resonator element 55 with a frame.

Preferably, a through hole 22 is formed in the center of the base substrate 54. The diameter of the through hole 22 gradually widens toward the exterior, as shown in FIG. 1. As described hereafter, the through hole 22 functions as a through hole for hole-sealing during the manufacturing process. In other words, after internal gas and the like generated during bonding is emitted from the through hole 22, the through hole 22 is sealed with a metal filling material or the like. As a result, the interior is hermetically sealed. The through hole 22 can be omitted. However, as described hereafter according to a third embodiment, the through hole 22 is required to for the hole sealing process to be performed.

The resonator element main body 32 will be described in detail, with reference to FIG. 5.

Preferably, as shown in FIG. 5, a recess or cut portions 71 and 72 is formed on the base section 51 in a position sufficiently separated from the edges of the base section 51 on the resonating arm side. The recesses or the cut portions 71 and 72 are formed on both edges so that the dimension of the base section 51 in the width direction is partially narrowed. The depth of the cut portions 71 and 72 (dimension q in FIG. 5) is, for example, preferably narrowed to a degree in which the depth matches the side edges of the outer side of the respective adjacent resonating arms 35 and 36. For example, the depth can be about 30 micrometers.

As a result, when the resonating arms 35 and 36 vibrate flexurally, vibration leakage leaks to the base section 51 side. Propagation to the frame section 53 is suppressed. The CI value can be kept low.

When depth dimension of the cut portions 71 and 72 are increased, although the increase is effective in the reduction of vibration leakage, the rigidity of the base section 51 itself decreases more than required. The stability of the flexural vibration of the resonating arms 35 and 36 is impaired.

According to the embodiment, a through hole 80 is formed in a position near the center of the base section 51 in the width direction, closer to the resonating arms 35 and 36 than a connecting portion 53a. The frame section 53 is integrally connected to the base section 51 at the connecting portion 53a.

The through hole 80 is, for example, a rectangular hole that penetrates the front and the back of the base section 51. The shape of the hole is not limited to the rectangle and can be circular, elliptical, square-shaped, or the like.

As a result, compared to the cut portions 71 and 72 being formed deeper, vibration leakage can be further suppressed and the CI value can be reduced without significantly reducing the rigidity of the base section 51.

Here, a length r of the through hole 80 in a base section 51 width direction is preferably about 50 micrometers. However, if a percentage of a dimension r of the through hole 80 and the above-described depth q of the cut portion 71 to a dimension e or, in other words, (r+q)/e is 30 percent to 80 percent, the reduction of the vibration leakage and a reduction of influence on a bonding area via the frame section 53 is positively affected.

Preferably, when a left cut portion is q and a right cut portion is q2, (r+q+q2)/e=about 30 percent.

According to the embodiment, to reduce package dimensions, a distance (dimension p) between a side surface of the base section 51 and the frame section 53 is 30 micrometers to 100 micrometers.

According to the embodiment, as shown in FIG. 5, an area at which the above-described frame section 53 extends or, in other words, the other end 53a (connecting portion) of the base section 51 is sufficiently separated from a base 52 of the resonating arms 35 and 36, by a distance BL2.

Preferably, the distance BL2 is a dimension exceeding a size of an arm width dimension c (W2) of the resonating arms 35 and 36.

In other words, when the resonating arms 35 and 36 of the tuning-fork-shaped resonator element flexurally vibrate, a range over which the vibration leakage is transmitted toward the base section 51 is correlated with the arm width dimension W2 of the resonating arms 35 and 36. The inventor has focused on the correlation and observed that an area to become a base edge of the frame section 53 is required to be appropriately positioned.

Therefore, according to the embodiment, regarding an area 53a (connecting portion) to become the base edge of the frame section 53, a position exceeding a dimension corresponding to the size of the arm width dimension W2 of the resonating arm is selected, with the base 52 of the resonating arm as the starting point. As a result, a structure can be achieved in which the propagation of the vibration leakage from the resonating arms 35 and 36 to the frame section 53 side is suppressed with further certainty. Therefore, the CI value can be suppressed. In addition, to acquire an operational effect resulting from fixing and bonding to the frame section 53, the position of 53a is preferably separated from an area of the base 52 (in other words, one edge of the base section 51) of the resonating arms 35 and 36 by the distance BL2.

For the same reason, an area in which the cut portions 71 and 72 are formed is also preferably from the area of the base 52 of the resonating arms 35 and 36 to an area exceeding the size of the arm width dimension W2 of the resonating arms 35 and 36. Therefore, the cut portions 71 and 72 includes an area in which the frame section 53 is integrally connected with the base section 51 and is formed in a position closer to the resonating arm than the included area.

Preferably, the cut portions 71 and 72 are formed in a position separated from the base (root) area by the arm width dimension W2×1.2. It is recognized that drive level characteristics can be made to correspond to a level of a normal piezoelectric resonator element, as a result.

Therefore, according to the embodiment, the arm width W2 of the resonating arm is about 40 to 60 micrometers. A distance k (MW2) between the resonating arms is about 50 to 100 micrometers.

According to the embodiment, a width dimension s of the frame section 53 in a Y direction is about 100 micrometers. A width dimension f in the X direction is 200 micrometers. The width dimension of the frame is preferably 50 micrometers to 300 micrometers. In other words, regarding the width dimensions of the frame, the dimension s is preferably smaller than the dimension f.

With regards to dimension balance when the resonator element main body 32 is miniaturized, because the dimension in the length direction (Y direction) increases, the dimension s is preferably small to reduce the size of the resonator element 55 with a frame. Because the frame section 53 serves as the bonding portion, the f dimension can be increased, and stress placed on the frame section 53 can be reduced.

According to the embodiment, the dimensions can be determined as described above. Following operational effects can be achieved while size reduction is achieved.

In the resonator element main body 32 in FIG. 1, the piezoelectric resonator element is integrated with the package via the frame section 53, rather than the piezoelectric resonator element being adhered and bonded to the package as in the past. Therefore, variations in stress placed on the bonding area thereof caused by changes in ambient temperature, dropping impact, and the like rarely affect the resonating arms 35 and 36, over the frame section 53, a curved distance to the other end 53a of the base section 51, and the distance of the length of the base section 51 exceeding the distance BL2. Therefore, the temperature characteristics are particularly favorable.

On the other hand, the vibration leakage from the resonating arms 35 and 36 that flexurally vibrate passes through a predetermined length of the base section 51 exceeding the distance BL2 until the base section 51 is passed and the frame section 53 is reached. Therefore, the vibration leakage has barely affected.

When the length of the base section 51 is extremely short, a situation can be considered in which leaked components of the flexural vibration spreads over the entire frame section 53 and becomes difficult to control. However, according to the embodiment, such situations can be sufficiently avoided.

In addition to achieving such operational effects, an overall size can be reduced because the frame section 53 is connected to the other end 53a (connecting portion) of the base section 51 and formed integrally with the package 57.

Figure 14:
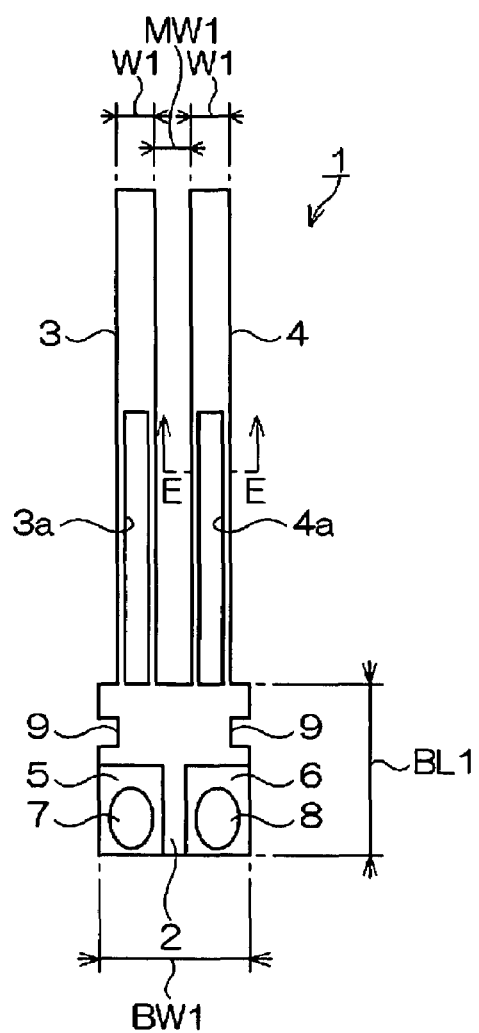
FIG. 14 is a schematic planar view of a related piezoelectric resonator element.

Furthermore, as can be clearly understood, compared with the configuration in FIG. 14, a bonding process is required to be performed by the configuration in FIG. 14 because FIG. 14 shows a structure in which conductive adhesives 7 and 8 are applied to mutually adjacent extraction electrode 5 and extraction electrode 6 and the extraction electrode 5 and the extraction electrode 6 are bonded. The bonding process is performed in which short-circuiting is avoided and the adhesives are within a very narrow range (on the package side) so that the extraction electrode 5 and the extraction electrode 6 do not come into contact. The bonding process was also required to be performed so that the adhesive does not run and cause a short circuit before hardening, after bonding. Therefore, the process is difficult.

On the other hand, in the resonator element main body 32 in FIG. 1, the integrated frame section 53 is integrally bonded with the package in a process described hereafter. Therefore, difficulties such as that described above rarely occur. There is also no risk of short circuiting.

FIG. 6 is a cross-sectional diagram taken along line A-A in FIG. 5. In the cross-sectional diagram of the resonating arm 36, the excitation electrode is omitted for sake of convenience in illustration and comprehension. Although an illustration thereof is omitted, a cross-sectional edge surface of the resonating arm 35 also has the same configuration. Redundant explanations will be omitted. Only the resonating arm 36 will be explained.

As described earlier, on the main surface of the resonating arm 36 or, in other words, on the front surface and the back surface (upper surface and lower surface) according to the embodiment, the long grooves 34 and 34 are formed, respectively extending in the length direction. A broken line KL shown in the diagram indicates a center position related to the arm width dimension c of the resonating arm 35.

Figure 13:
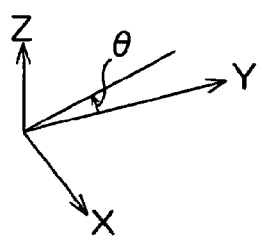
FIG. 13 is a diagram of coordinate axes of a quartz crystal Z plate.

In the manufacturing process described hereafter, the piezoelectric resonator element according to the embodiment is formed using, for example, a quartz crystal wafer as a piezoelectric substrate, among piezoelectric materials. The quartz crystal wafer is a device layer of a size in which the resonator element main body 32 can be separated into plural pieces or into a large number of pieces, integrally with the frame section 53. In other words, the device layer, also described in a process described hereafter, is cut from the piezoelectric material such as a single crystal of quartz crystal so that an X axis shown in FIG. 5 is an electrical axis, a Y axis is a machine axis, and a Z axis is an optical axis. When the above described quartz crystal wafer is cut from the single crystal of quartz crystal, in the Cartesian coordinate system including the above-described X axis, Y axis, and Z axis, a quartz crystal Z plate that has been cut and ground to a predetermined thickness is used. The quartz crystal Z plate is rotated within a range of zero degrees to five degrees (θ in FIG. 13) in the clock-wise direction with the Z axis as the center and cut.

As shown in FIG. 6, between thickness dimensions HK2 and MK2 of walls on both sides of the resonating arm 36, sandwiching the long groove 34, HK2 that is on a negative X axis side is larger. Therefore, the center of gravity of the resonating arm 36 is clearly closer to the negative X axis side than the above-mentioned center line KL.

According to the embodiment, the positions at which the long grooves 34 and 34 are formed are changed. The (center position of the width dimension of the) long grooves 34 and 34 are de-centered to become closer to the negative X axis side than in the past.

The reason is as follows. In the resonating arm 36 such as that in FIG. 6, as in the past, when the center position of the long groove 34 in the width direction aligns with the center position of the arm width in the width direction (refer to FIG. 14), the center of the long groove 34 in the width direction does not pass through the position of the center of gravity. The flexural vibration of the resonating arm is obstructed.

Therefore, as described above, by a center position MC of the width dimension of the long groove 34 being de-centered in the negative X axis direction, the center position MC of the width dimension of the long groove 34 becomes closer to the position of the center of gravity of the resonating arm in the width direction. The left and right weight balance of the resonating arm can be adjusted. As a result, even when the piezoelectric resonator element is miniaturized, the groove width of the long groove is narrowed, and a size of a fin 81 (described hereafter) is reduced, stable flexural vibration of the resonating arm can be actualized. The resonator element main body 32 having superior drive level characteristics can be provided.

To actualize such a structure, half-etching is performed in an etching (half-etching) process performed on the long groove, described hereafter, not over an area centered around the center line KL as in the past, but, for example, by shifting a mask used for etching to the negative X axis side, by a distance of CW.

In this case, as shown in FIG. 7, regarding a dimension of a distance between an outer edge of the long groove 34 formed on the resonating arm 36 and an outer edge of the resonating arm 36, after the long grooves 34 and 34 are formed, the distance dimension m1 on the positive X axis side is larger than the distance dimension m2 on the negative X axis side. In other words, the dimension of the distance between the outer edge of the long groove 34 formed on the resonating arm 36 and the outer edge of the resonating arm 36 is required to be accurately provided on the positive X axis side and the negative X axis side, respectively. As a result, polarization of the electrode can be performed with certainty. However, when the position at which the mask is disposed is designed so that the distance dimension m1 on the positive axis side is larger than the distance dimension m2 on the negative X axis side, during formation of the long grooves 34 and 34 by half-etching, the above-described configuration can be appropriately realized without the center position of the width dimension of the long groove being shifted in the negative X axis direction.

Specifically, when the center of gravity of the resonating arm 36 is closer to the negative X axis side than the center line KL by about 3 micrometers, the center position of the long groove 34 is shifted to the negative X axis side. When the center of gravity of the resonating arm 36 and the center line KL are aligned, the dimension m2 in FIG. 6 becomes extremely small. As a result, the electrode polarization in this area becomes difficult. Therefore, as a result of the long groove 34 being de-centered to the negative X axis side (position shifting) by about one micrometer to three micrometers, ill effects such as that described above do not occur. Relatively stable flexural vibration can be achieved.

Next, a detailed preferred structure of the resonator element main body 32 according to the embodiment will be described.

Each resonator arm 35 and 36 of the resonator element main body 32 shown in FIG. 5 has the same shape. Therefore, with regards to the resonating arm 36, the resonating arm width c is the widest at a base portion T where each resonating arm extends from the base section 51. Between a position of T that is the base of the resonating arm 36 to a position U that is separated by a slight distance toward the tip side of the resonating arm 36, a first narrowing width portion TL is formed. At the first narrowing width portion TL, the width suddenly becomes narrow. A second narrowing width portion TL is formed from the position U that is the end of the first narrowing width portion TL, further toward the tip side of the resonating arm 36, to a position P. In other words, the second narrowing width portion TL is formed over a distance CL of the resonating arm. At the second narrowing width portion, the width gradually and consecutively becomes narrow.

Therefore, as a result of the first narrowing width portion TL being provided, vicinity of the base of the resonating arm 36 near the base section has high rigidity. As a result of the second narrowing width portion CL being formed, rigidity consecutively declines from the end U of the first narrowing width portion TL toward the tip. An area of P is a changing point P of the arm width. The area is a position at which the shape of the resonating arm 36 is constricted and, therefore, can also be referred to as a constriction position P. The arm width of the resonating arm 36 further toward the tip side from the changing point P of the arm width is extended with the same dimension or is preferably gradually and slightly enlarged, as shown in the diagram.

The longer the long grooves 33 and 34 in FIG. 5 are, the better the energy field efficiency of the material forming the resonating arms 35 and 36. It is known that the CI value of the tuning-fork-shaped resonator element decreases, the longer a length j from the base section 51 of the long grooves 33 and 34 to an entire length b of the resonator arm is, at least up to about $j/b=0.7$. Therefore, preferably, $j/b=0.5$ to $0.7$. According to the embodiment, the entire length b of the resonator arm 36 in FIG. 5 is, for example, about 1100 micrometers to 1400 micrometers.

When the long groove is of an appropriate length and the CI value is sufficiently suppressed, next, a CI value ratio (CI value of harmonic wave/CI value of fundamental wave) of the resonator element main body 32 becomes a problem.

In other words, when a CI value of the harmonic wave is suppressed simultaneously with the reduction of a CI value of the fundamental wave and the CI value of the harmonic wave becomes smaller than the CI value of the fundamental wave, oscillation is facilitated as a result of the harmonic wave.

The CI value ratio (CI value of harmonic wave/CI value of fundamental wave) can be further increased while reducing the CI value by not only the long groove being lengthened and the CI value being reduced, but also by the changing point P of the arm width being provided closer to the tip of the resonating arm.

In other words, rigidity of a root portion or, in other words, the vicinity of the base of the resonator arm 36 is strengthened by the first narrowing width portion TL. As a result, the flexural vibration of the resonator arm can be further stabilized. In combination with the formation of the through hole 80, the CI value can be suppressed.

Furthermore, by the second narrowing width portion CL being provided, the rigidity of the resonating arm 36 gradually declines from the vicinity of the root thereof, toward the tip side, to the constriction position P that is the changing point of the arm width. From the constriction position P further toward the tip side, the long groove 34 is not present and the arm width c is gradually expanded. As a result, the rigidity increases toward the tip side.

Therefore, it is thought that a "section" of the vibration of a vibration in the second-order harmonic wave can be positioned on the resonating arm 36 to be closer to the tip side. As a result, even when the long groove 34 is lengthened and the electrical field efficiency of the piezoelectric material is increased, the reduction in the CI value of the second-order harmonic wave can be prevented while suppressing the CI value of the fundamental wave. Thus, as shown in FIG. 5, by the changing point P of the arm width being preferably provided closer to the tip side of the resonator arm than the tip section of the long groove, the CI value ratio can be increased almost with certainty and the oscillation caused by the harmonic wave can be prevented.

Furthermore, according to study by the inventor, the above-described j/b when the length from the base section 51 of the long groove 33 and 34 is j to the entire length b of the resonating arm, an arm width narrowing rate M that is a value of the maximum width/minimum width of the resonating arm 36, and the CI value ratio (=CI value of second-order harmonic wave/CI value of fundamental wave) corresponding thereto are correlated.

It has been confirmed that when j/b=61.5 percent, if the arm width narrowing rate M that is a value of the maximum width/minimum width of the resonating arm 36 is larger than 1.06, the CI value ratio can be larger than 1. The oscillation caused by the harmonic wave can be prevented.

Therefore, even when the entire piezoelectric resonator element is miniaturized, the CI value of the fundamental value can be kept low. A piezoelectric resonator element can be provided in which the drive level characteristics do not deteriorate.

Next, a more preferable structure of the resonator element main body 32 will be described.

A wafer thickness indicated by a dimension x in FIG. 7 or, in other words, a thickness of the quartz crystal wafer forming the piezoelectric resonator element is preferably 70 micrometers to 130 micrometers.

An entire length of the resonator element main body 32 indicated by dimension a in FIG. 5 is about 1500 micrometers to 1800 micrometers. A dimension b that is the entire length of the resonating arm is preferably 1100 micrometers to 1400 micrometers and an entire width d of the piezoelectric device 30 is 400 micrometers to 600 micrometers, with regards to size reduction of the piezoelectric device. Therefore, to reduce the size of the tuning-fork portion, a width dimension e of the base section 51 is 200 micrometers to 400 micrometers.

The dimension k between the resonating arms 35 and 36 in FIG. 5 is preferably 50 micrometers to 100 micrometers, as described above. The dimension k is, for example, 84 micrometers. If the dimension k is smaller than 50 micrometers, when the outline of the resonator element main body 32 is formed by the quartz crystal wafer being penetrated by wet-etching, as described hereafter, it is difficult to sufficiently reduce the size of an irregular-shaped portion based on etching anisotropy or, in other words, a fin-shaped projection toward the positive X axis direction on the resonating arm side surface, indicated by reference numeral 81 in FIG. 7. If the dimension k is equal to or more than 100 micrometers, there is risk of the flexural vibration of the resonating arm becoming unstable.

The dimensions m1 and m2 of the outer edge of the long groove 33 in the resonating arm 35 (same applies to the resonating arm 36) and the outer edge of the resonating arm are both preferably 3 micrometers to 15 micrometers. If the dimensions m1 and m2 are equal to or less than 15 micrometers, the electrical field efficiency is enhanced. If the dimensions m1 and m2 is equal to or more than 3 micrometers, it is advantageous in polarizing the electrode with certainty.

If a dimension n of the first narrowing width portion TL of the resonating arm 36 in FIG. 5 is equal to or more than 11 micrometers, an advantageous effect on the suppression of the CI value can be expected with certainty.

In the resonating arm 36 in FIG. 5, a degree of widening by which the tip side is wider than the changing point P of the arm width preferably increases by 0 micrometers to 20 micrometers, from the width of the area of the changing point P of the arm width that is an area at which the arm width of the resonating arm 36 is the narrowest. When the widening exceeds the degree of widening, the tip of the resonating arm 36 becomes too heavy. The stability of the flexural vibration may be impaired.

As described above, the irregular-shaped portion 81 that projects toward the positive X axis in a fin-shape is formed on one side surface of the outer side of the resonating arm 35 (the same applies to resonating arm 36) in FIG. 7. When the outline of the piezoelectric resonator element is formed by wet-etching, the irregular-shaped portion 81 is formed as etching residue as a result of the etching anisotropy of quartz crystal. Preferably, a projection amount v is reduced to be within 5 micrometers by etching being performed for 9 hours to 11 hours, within an etchant including hydrofluoric acid and ammonium fluoride, to enhance the electrical field efficiency and reduce the CI value.

The width dimension of the long groove indicated by a dimension g in FIG. 5 is preferably about 60 percent to 90 percent of the arm width c of the resonating arm, in the area of the resonating arm in which the long groove is formed. The first narrowing width portion and the second narrowing width portion are formed in the resonating arms 35 and 36. Therefore, the arm width c differs depending on the position of the resonating arm in the length direction. However, the width g of the long groove is about 60 percent to 90 percent of the widest width of the resonating arm. If the width of the long groove is narrower than that above, the electrical field efficiency deteriorates, leading to an increase in the CI value.

The position of the base section 51 side edge of the long grooves 33 and 34 is the same as the base of the resonating arms 35 and 36 or, namely, the position T in FIG. 5. However, the position is preferably slightly closer to the resonating arm tip side than the position T and is within a range in which the first narrowing width portion TL is present. In particular, the position preferably is not closer to the base edge of the base section 51 than the position T.

Figure 8:
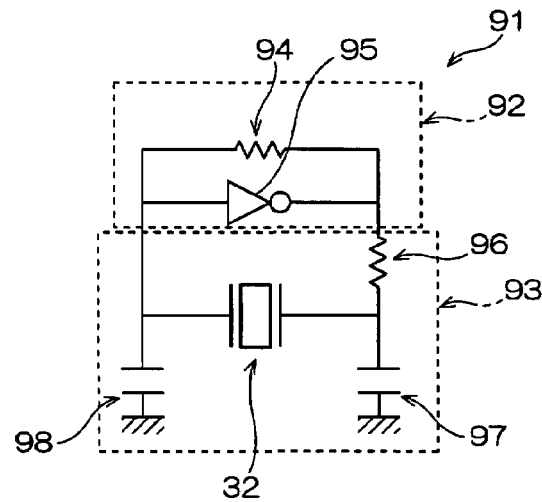
FIG. 8 is a circuit diagram of an example of an oscillator circuit when a piezoelectric oscillator is configured using the piezoelectric device according to the embodiment.

FIG. 8 is a circuit diagram of an example of an oscillator circuit when a piezoelectric oscillator is configured using the piezoelectric device 30 according to the embodiment.

An oscillator circuit 91 includes an amplifier circuit 92 and a feedback circuit 93.

The amplifier circuit 92 includes an amplifier 95 and a feedback resistor 94. The feedback circuit 93 includes a drain resistor 96, capacitors 97 and 98, and the resonator element main body 32.

The feedback resistor 94 in FIG. 8 is, for example, about 10 MΩ (mega ohms). A complementary metal-oxide-semiconductor (CMOS) inverter can be used as the amplifier 95v. The drain resistor 96 is, for example, 200 kΩ (kilo ohms) to 900 kΩ. A capacitor 97 (drain capacity) and a capacitor 98 (gate capacity) can respectively be 10 pF (picofarad) to 22 pF.

The piezoelectric device 30 according to the embodiment is configured as described above. In the structure, the package 57 houses the resonator element main body 32, serving as the piezoelectric resonator element. The package 57 includes the base substrate 54 and the frame section 53 of the resonator element 55 with a frame. The lid 56 is layered over the frame section 53. The layers are hermetically sealed.

Therefore, because the resonator element main body 32 is integrally formed with the frame section 53, the resonator element main body 32 is not required to be fixed to the package 57 using the adhesive or the like. There is no difficult bonding, even when the piezoelectric device 30 is formed compactly.

The base substrate 54, the resonator element 55 with a frame layered over and fixed to the base substrate 54, and the lid 56 layered over and fixed to the resonator element 55 with a frame are formed from the same material. Therefore, stress caused by changes in the thermal environment is not applied to the bonding portion, even when the base substrate 54, the resonator element 55 with a frame, and the lid 56 are bonded in the layered state.

As described hereafter regarding the manufacturing process, the base substrate 54, the resonator element 55 with a frame, and the lid 56 can be suitably bonded even when the materials thereof are the same by, for example, plasma being irradiated onto each bonding surface thereof, thereby activating the front surface of the bonding surface (surface activation bonding). Heating is not required during bonding. Therefore, a structure without ill-effects caused by heat can be actualized.

Therefore, the piezoelectric device 30 can be provided in which, when the piezoelectric device 30 is miniaturized, the drive level characteristics are favorable, stress does not remain in the bonding portion of the housing body, the interior of a case can be a high-vacuum environment, and a factor causing deterioration of characteristics does not remain.

(Method for Manufacturing Piezoelectric Device According to First Embodiment)

Figure 9:
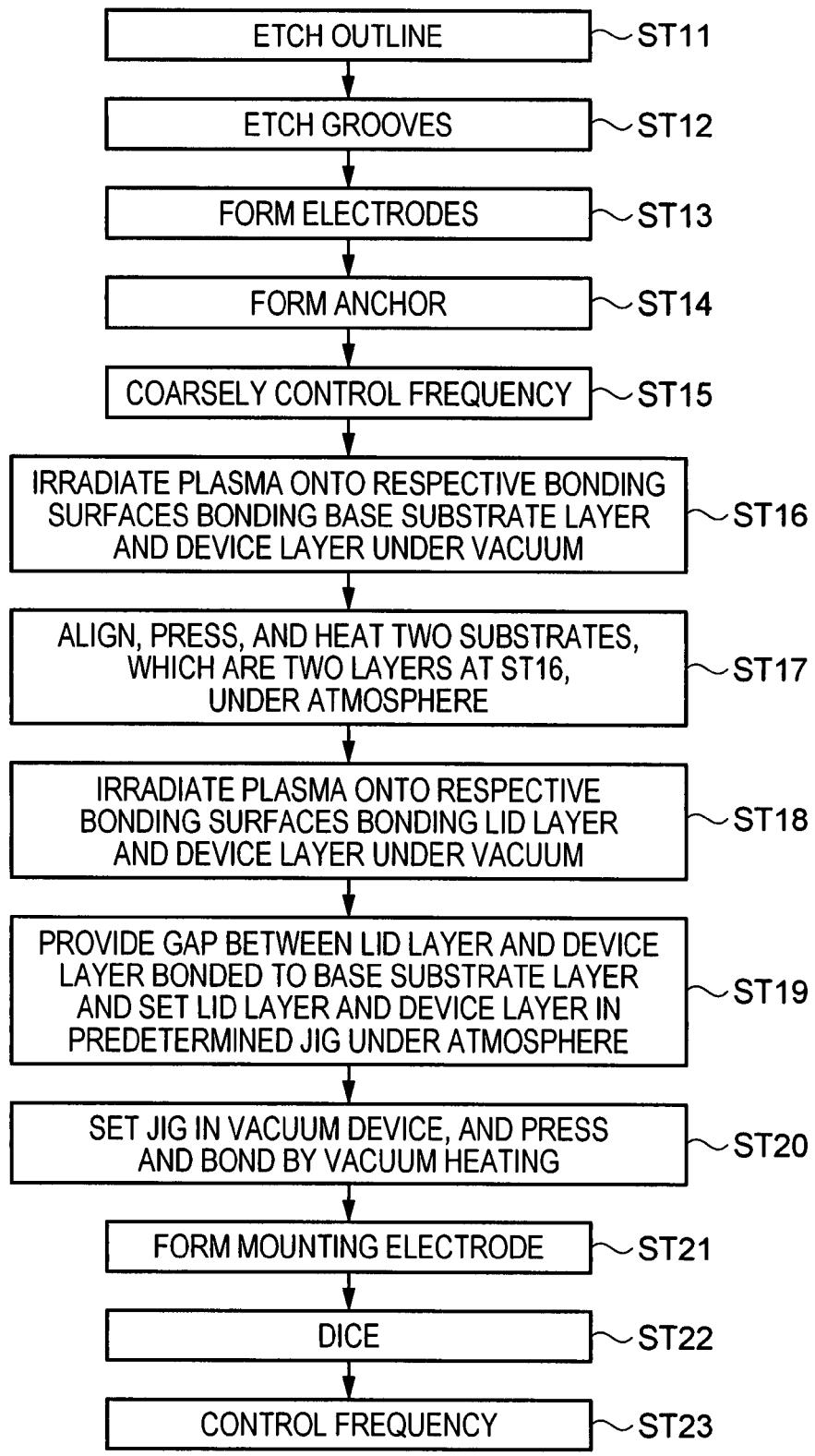
FIG. 9 is a flowchart of a method for manufacturing the piezoelectric device in FIG. 1 according to a first embodiment.

Next, a method for manufacturing the above-described piezoelectric device 30 according to a first embodiment will be described, with reference to the flowchart in FIG. 9 and a process diagram (partial) in FIG. 10.

A process for manufacturing the piezoelectric device 30 has a front-end process and a post-process.

(Front End Process)

The front-end process in the method for manufacturing the piezoelectric device 30 includes a base substrate layer forming process, a device layer forming process, and a lid layer forming process. In the base substrate layer forming process, a plurality of base substrates 54 are simultaneously formed. In the device layer forming process, a plurality of resonator elements with a frame are simultaneously formed. In the lid layer forming process, a plurality of lids are simultaneously formed. The base substrate layer forming process, the device layer forming process, and the lid layer forming process are performed separately. In other words, the front-end process is a process for assembly preparation, in which a plurality of processes are performed in parallel. The processes are performed using almost the same method. Therefore, the processes will be described collectively.

Figure 10:
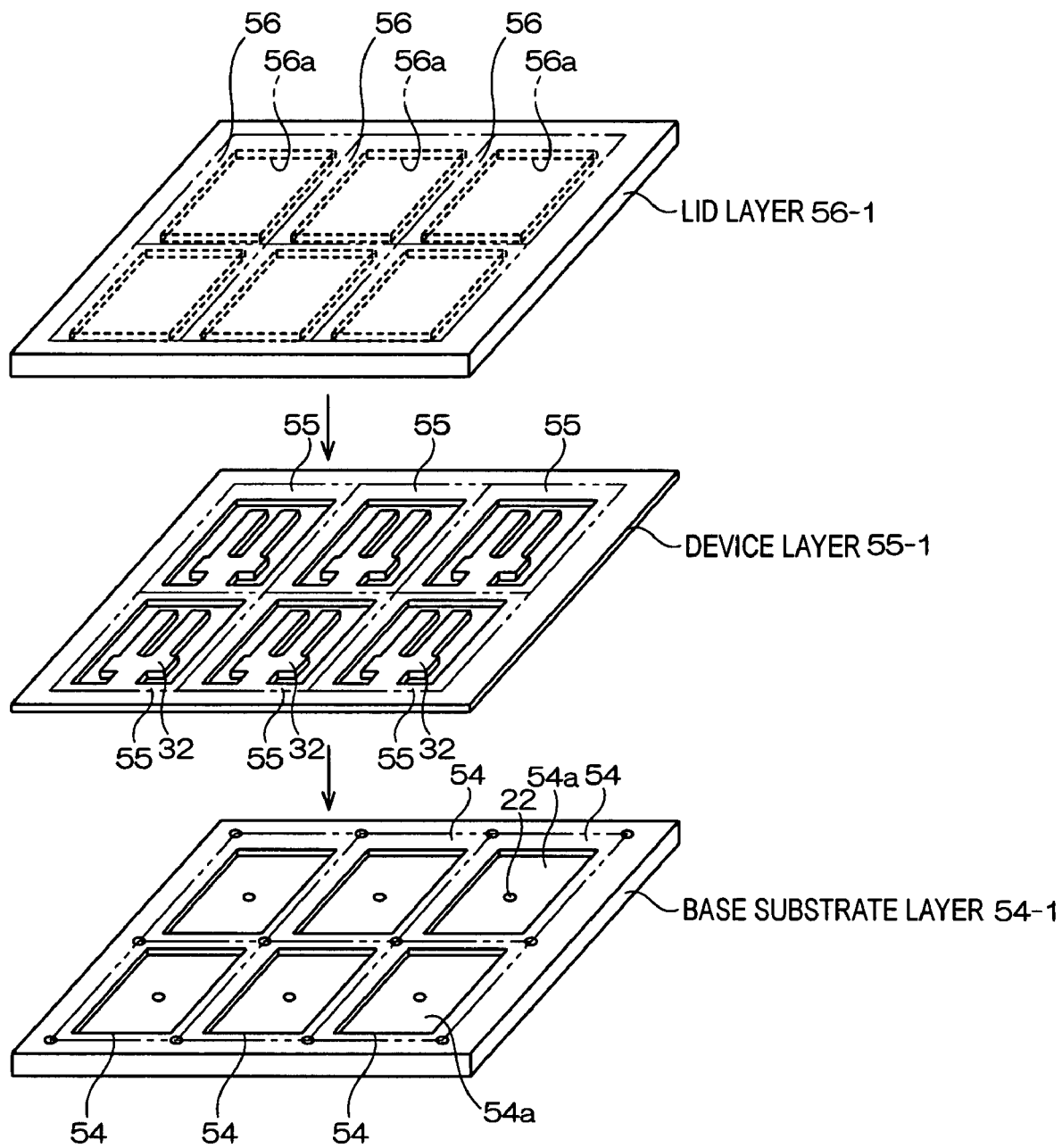
FIG. 10 is a perspective block diagram of a portion of a process in FIG. 1.

In FIG. 10, a base substrate layer 54-1 is a wafer on which a plurality or a large number of base substrates 54 are vertically and horizontally aligned. A device layer 55-1 is a wafer on which a plurality or a large number of resonator elements 55 with a frame are vertically and horizontally aligned. A lid layer 56-1 is a wafer on which a plurality or a large number of lids 56 are vertically and horizontally aligned. The base substrate layer 54-1, the device layer 55-1, and the lid layer 56-1 are the same quartz crystal wafer described in detail, above.

A large number of recesses 56a can be simultaneously formed on the lid layer 56-1 by, for example, dry-etching or wet-etching. On the bonding surface side of the lid layer 56-1, the conductive pattern 86, described with reference to FIG. 4, is formed around the recess 56a. The conductive pattern 86 is formed by chrome film and gold film being sequentially formed by deposition, sputtering, plating, or the like. For example, a chrome film with a film thickness of 100 angstroms to 500 angstroms and a gold film with a film thickness of 300 angstroms to 5000 angstroms are formed.

Similarly, a plurality of recesses 54a are simultaneously formed on the base substrate layer 54-1 by etching, as described above. Furthermore, etching is performed and a large number of through holes 22 are simultaneously formed.

On the base substrate layer 54-1, the conductive patterns 87 and 88 described with reference to FIG. 3A are formed around the recess 54a. In this case, as well, the conductive patterns 87 and 88 are formed by chrome film and gold film being sequentially formed by deposition, sputtering, plating, or the like. For example, the chrome film with a film thickness of 100 angstroms to 500 angstroms and the gold film with a film thickness of 300 angstroms to 5000 angstroms are formed.

A processing performed on the device layer 55-1 will be described with reference to FIG. 9.

A quartz crystal wafer used to form the device layer 55-1 is prepared and an outline, such as that described with reference to FIG. 5, is formed by etching performed using, for example, hydrofluoric acid solution (ST11).

Next, the long grooves 33 and 34 described with reference to FIG. 5 are formed by half-etching (ST12). Then, an electrode forming process is performed to form the excitation electrodes 37 and 38, serving as the electrodes for driving, and the extraction electrodes 37a and 38a (ST13). In the process, each conductive pattern (extension section of the extraction electrode) of the frame section 53, described with reference to FIG. 2A and FIG. 2B, are simultaneously formed on the device layer 55-1.

An electrode film includes, for example, a foundation layer and an electrode layer. Chrome and nickel are suitable for the foundation layer. Gold is suitable for the electrode layer. The layers can be sequentially formed by methods such as sputtering and deposition. For example, the chrome film with a film thickness of 100 angstroms to 500 angstroms and the gold film with a film thickness of 300 angstroms to 5000 angstroms are formed. Furthermore, as a result of sputtering being further continued or the like, an anchor electrode 21 is formed on the tip of each resonating arm 35 and 36 of the resonator element main body 32 (ST14). The anchor electrode 21, described with reference to FIG. 1, is used for frequency adjustment.

Next, as a result of the device layer 55-1 before bonding being energized and predetermined driving voltage being applied thereto, an electrode is added or trimming is performed by a laser beam or the like, while a frequency outputted by excitation is monitored. As a result, a coarse adjustment of the frequency can be made (ST15).

(Bonding Process)

(Surface Activation Process)

In the invention, the surface activation process is performed before a bonding process.

In other words, during the above-described type of bonding is performed, bonding was performed under heat, such as by anodic bonding. "Anodic bonding" is a method in which front surfaces are placed close together and bonded while still in a solid phase. It is thought that electrostatic attraction is generated between the bonding surfaces, and the bonding surfaces closely contact each other. Ion is transferred from the glass side to the electrode side by an intense electric field. The ion forms a covalent bond with an atom of the electrode side at a boundary therebetween and bonding is performed. Therefore, as a result of the electric field taking effect, a material, such as glass, that generates the ion and the metal film are bonded. Bonding cannot be achieved between the same materials.

Because bonding is performed under heat, an environment in which heat and the electric field take effect is required. Not only is this inconvenient, but residual heat stress after bonding may have an ill effect on a product.

On the other hand, in surface activation bonding, the front surface of the bonding surfaces are activated and bonded. Specifically, contaminants or, in other words, a front surface layer is removed and bonding obstructions are removed (physical process). Contaminants include, for example, oxidized layer, absorbed water molecules, and organic molecules. By the bonding surface being further improved and activated (chemical process), a state is made in which bonding of each bonding surface with a "bonding partner" of the bonding surface is facilitated. Each bonding surface comes into contact with the "bonding partner". Therefore, heat is not necessarily required (heating can be performed if an environment permits heating) and the intense electric field is not required. Not only does surface activation bonding not have the disadvantages of anodic bonding, but surface activation bonding is also superior in that the same material can be bonded.

Therefore, plasma is irradiated onto the bonding surface of each layer to be bonded (ST16).

Specifically, the base substrate layer 54-1 and the device substrate layer 55-1 in FIG. 10 are, for example, housed in a vacuum chamber. Predetermined masking is performed and the bonding surface of each layer to be bonded together is exposed. In this case, the plasma is irradiated onto an area of the base substrate layer 54-1 corresponding to the conductive patterns 87 and 88 described with reference to FIG. 3A and the conductive patterns (extension section of the extraction electrode) 37b and 38b of the frame section 53 described with reference to FIG. 2B, on the device layer 55-1. The same metal films serve as the bonding surfaces.

As a plasma processing system, reactive ion etching (RIE) can be used. An inductively-coupled-plasma (ICP)-type RIE reactor and a surface-wave-plasma (SWP)-type RIE reactor can be suitably used.

In the physical process that mainly removes contaminants from the front surface, the process can be achieved by plasma being generated using respective gases Ar, $CF_4$, and $N_2$.

In mainly the above-described activation or, in other words, the chemical process, the process can be achieved by plasma being generated using respective gases $O_2$, $O_2+CF_4$, and $O_2+N_2$.

According to the embodiment, as the physical process, Ar gas is introduced into the vacuum chamber. A time plasma process of about one minute is performed with a degree of vacuum within the vacuum chamber of about 20 Pas to 30 Pas.

Next, the respective above-described bonding surfaces the base substrate layer 54-1 and the device layer 55-1, of which the front surfaces have been irradiated by plasma and activated, are placed together, aligned under atmosphere, pressed, and bonded under heat of about 100 degrees (Celsius) (all temperatures hereafter are in "Celsius") (ST17). In other words, in the process, the base substrate layer 54-1 and the device layer 55-1 are bonded.

Next, plasma is irradiated under vacuum onto each bonding surface (conductive pattern) used to bond the device layer 55-1 and the lid layer 56-1 under vacuum (ST18).

The plasma is irradiated by the same method as that described at ST17.

Then, respective bonding surface of the device layer 55-1 and the lid layer 56-1, of which the front surface has been irradiated with plasma and activated, are placed facing each other and respectively set in a predetermined jig, separated by a predetermined gap, under atmosphere (ST19).

The jig is placed within the vacuum chamber and pressed for about 30 minutes under a degree of vacuum of about $10^{-5}$ Torr and a temperature of about 200 degrees to 250 degrees (ST20).

As a result, bonding is performed. Pressing and bonding is performed under vacuum and the interior of the package or the case is hermetically sealed with high precision. As a result, vibration performance of the housed piezoelectric resonator element is not impaired. Therefore, a CI (crystal impedance) value having a low practical level can be achieved.

Because all layers in FIG. 10 are bonded, the mounting terminals 26 and 27, described with reference to FIG. 3B, are formed on the bottom surface (back surface) of the base substrate layer 54-1. In this case, the mounting terminals 26 and 27 are formed by patterns being formed in chrome and gold using sputtering, followed by nickel-plating, and further followed by gold-plating on a top layer thereof (ST21).

Next, with reference to FIG. 10, each layer is cut along a cutting line along a chained line drawn vertically and horizontally (cutting process) (ST22).

Finally, the anchor electrode 21 on the tip of each resonating arm of the resonator element main body 32 is trimmed by, for example, a laser beam being irradiated from an external source so as to pass through the lid of individual piezoelectric devices 30. Then, a frequency-reduction-type frequency adjustment (fine adjustment) is performed (ST23).

As a result of the above, the piezoelectric device 30 is completed.

In the method for manufacturing according to the embodiment, as a result of plasma or the like being irradiated onto each bonding surface of the base substrate layer 54-1, the device layer 55-1, and the lid layer 56-1, the front surface of the bonding surface can be activated. Therefore, a structure is actualized in which the same material can be bonded. By the cutting process, such as dicing, being performed after bonding, a large number of piezoelectric devices 30 can be efficiently manufactured, simultaneously. Furthermore, a method of manufacturing can be provided in which, when the piezoelectric device is miniaturized, the drive level characteristics are favorable, stress does not remain in the bonding portion of the housing body, and a factor causing deterioration of characteristics does not remain.

Moreover, the excitation electrodes 37 and 38, formed on the resonator element main body 32 and serving as the electrode for driving, are routed to the frame section 53 as (the extension section of) the extraction electrodes 37b and 38b. As a result of bonding, (the extension section of) the extraction electrodes 37b and 38b of the frame section 53 are electrically connected to the mounting terminals 26 and 27, provided on the base substrate and serving as the external terminals, via the conductive patterns 87 and 88 and the conductive patterns 84 and 85 formed on the bonding surface of the base substrate 54. Therefore, when the base substrate 54 and the resonator element 55 with a frame are bonded, an operation related to an electrical connection for transmitting the driving voltage to the resonator element main body 32 is not required.

Method for Manufacturing Piezoelectric Device According to Second Embodiment

Figure 11:
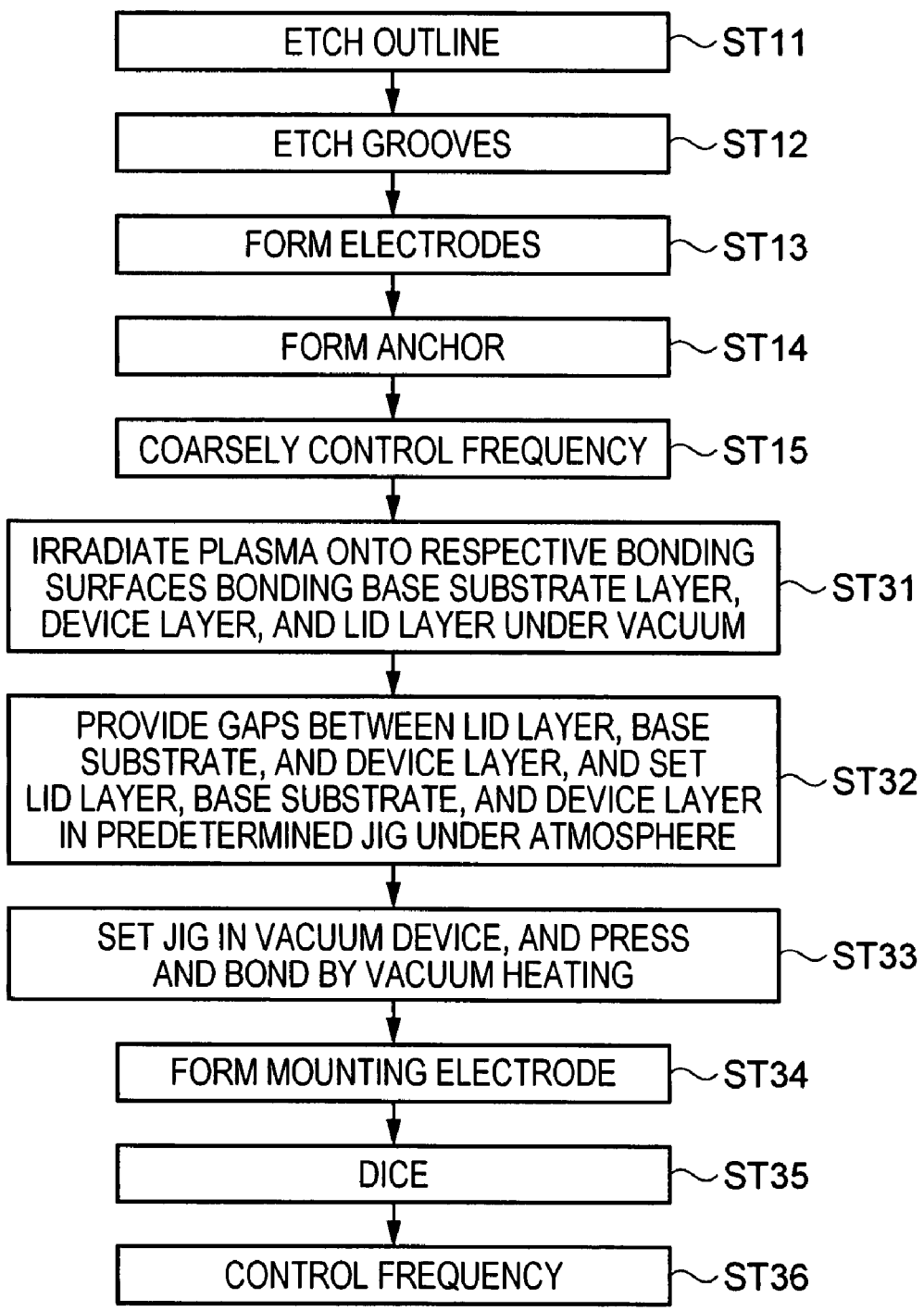
FIG. 11 is a flowchart of a method for manufacturing the piezoelectric device in FIG. 1 according to a second embodiment.

Next, a method for manufacturing the above-described piezoelectric device 30 according to a second embodiment will be described, with reference to the flowchart in FIG. 11.

The front-end process and ST11 to ST15 in the process for manufacturing the piezoelectric device 30 are the same as those according to the first embodiment. Explanations thereof and of other processes shared with the first embodiment are omitted. Hereafter, differences are mainly described.

(Bonding Process)

(Surface Activation Process)

The surface activation process performed according to the embodiment is the same as that performed according to the first embodiment.

In the method for manufacturing, the base substrate layer 54-1, the device layer 55-1, and the lid layer 56-1 in FIG. 10 are all housed within, for example, the vacuum chamber. Predetermined masking is performed. The bonding surface (conductive pattern) of each layer to be bonded together is exposed, and plasma is irradiated thereto (ST31).

Next, the base substrate layer 54-1, the device layer 55-1, and the lid layer 56-1 after plasma irradiation, of which the front surface of the bonding surface has been activated, are removed from the vacuum chamber and set in the predetermined jig, under atmosphere, separated by the predetermined gap (ST32).

The jig is placed within the vacuum chamber and pressed for about 30 minutes under a degree of vacuum of about $10^{-5}$ Torr and a temperature of about 200 degrees to 250 degrees (ST33).

Subsequent processes are the same as the processes subsequent to ST21 of to the first embodiment.

The second embodiment is configured as described above. The front surfaces of the base substrate layer 54-1, the device layer 55-1, and the lid layer 56-1 are all simultaneously activated, thus improving efficiency.

Regarding other points, the same operation effects as those according to the first embodiment are achieved.

Method for Manufacturing Piezoelectric Device According to Third Embodiment

Figure 12:
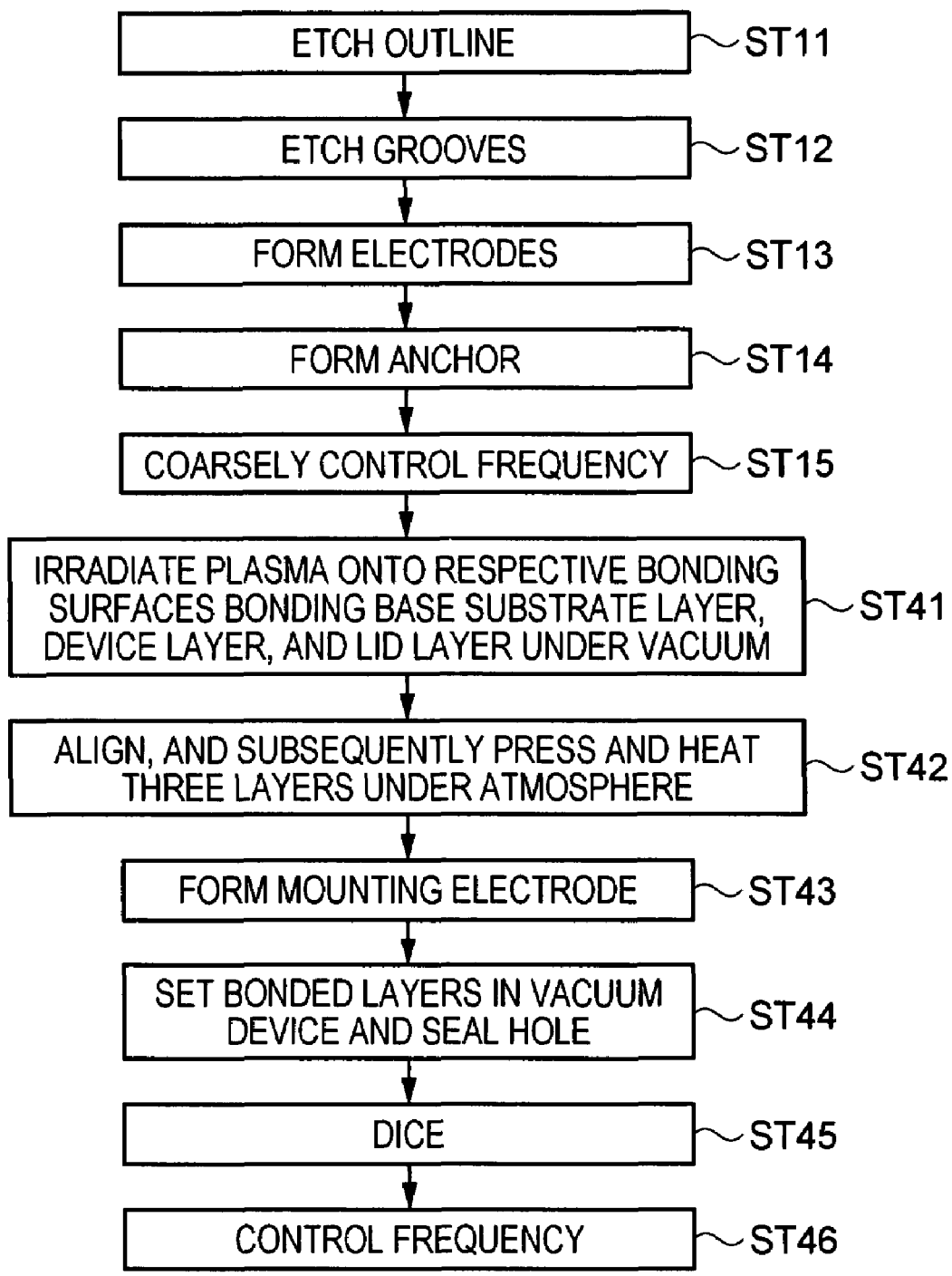
FIG. 12 is a flowchart of a method for manufacturing the piezoelectric device in FIG. 1 according to a third embodiment.

Next, a method for manufacturing the above-described piezoelectric device 30 according to a third embodiment will be described, with reference to the flowchart in FIG. 12.

The front-end process and ST11 to ST15 in the process for manufacturing the piezoelectric device 30 are the same as those according to the first embodiment. Explanations thereof and of other processes shared with the first embodiment are omitted. Hereafter, differences are mainly described.

The base substrate layer 54-1, the device layer 55-1, and the lid layer 56-1 in FIG. 10 are all housed within, for example, the vacuum chamber. Predetermined masking is performed. The bonding surface (conductive pattern) of each layer to be bonded together is exposed. Plasma is irradiated onto the exposed bonding surfaces (ST41).

Conditions for plasma irradiation and the like are the same as those according to the first embodiment.

Next, respective bonding surface of the base substrate layer 54-1, the device layer 55-1 and the lid layer 56-1, of which the front surface has been irradiated with plasma and activated, are placed facing each other, respectively set in a predetermined jig, separated by a predetermined gap, under atmosphere, and heated and bonded.

Because all layers in FIG. 10 are bonded, the mounting terminals 26 and 27, described with reference to FIG. 3B, are formed on the bottom surface (back surface) of the base substrate layer 54-1 (ST43).

Then, for example, in a state in which the three layers are bonded, the three layers are turned upside down within the vacuum chamber. A metal ball, such as gold germanium, is placed in each through hole 22. A laser beam or the like is successively or simultaneously irradiated onto each metal ball, under heat, thereby melting the metal ball. The through hole 22 is filled with the molten metal, and gas from within the package 57 is emitted from the through hole 22 (hole-sealing). As a result, the package 57 is hermetically sealed (ST44).

Subsequent ST45 and ST46 are respectively the same as ST22 and ST23 of the first embodiment.

The third embodiment is configured as described above. The front surfaces of the base substrate layer 54-1, the device layer 55-1, and the lid layer 56-1 are all simultaneously activated, thus improving efficiency. Furthermore, the hole-sealing process (S44) is performed, thereby preventing gas from being deposited in the resonator element main body. As a result, product quality is enhanced.

Regarding other points, the same operation effects as those according to the first embodiment are achieved.

The present invention is not limited to the above-described embodiments. Respective configurations of the embodiments and variation examples can be appropriately combined, omitted, and combined with another configuration (not shown).

The invention is not limited to a piezoelectric device in which the piezoelectric resonator element is stored with in the box-shaped package, but can be applied to a piezoelectric device in which the piezoelectric resonator element is stored with in a cylindrical package, a piezoelectric device in which the piezoelectric resonator element functions as a gyro sensor. Furthermore, the invention can be applied to any piezoelectric device using the piezoelectric resonator element, regardless of a name given to the piezoelectric element, the piezoelectric oscillator, and the like. Although a pair of resonating arms is formed in the resonator element main body 32, this is not limited thereto. The resonating arms can also be three arms, four arms, or more.

The invention claimed is:

1. A piezoelectric device including a base substrate, a resonator element with a frame layered over and fixed to the base substrate, and a lid layered over and fixed to the resonator element with a frame, wherein:

the base substrate, the resonator element with a frame, and the lid are all formed from a same material or are formed from materials having very similar coefficients of linear expansion;

the resonator element with a frame includes a resonator element main body that is a piezoelectric resonator element section and a frame section formed so as to surround a periphery of the resonator element main body;

each bonding surface bonding the base substrate, the resonator element with a frame, and the lid is bonded by surface activation bonding and hermetically sealed;

an electrode for driving formed on the resonator element main body is routed to the frame section as an extraction electrode, and the extraction electrode of the frame section is electrically connected to a mounting electrode, provided on the base substrate and serving as an external terminal, by bonding, via a conductive pattern formed on a bonding surface of the base substrate; wherein the resonator element main body that is the piezoelectric resonator element section includes a base section extending from an inner side of an edge forming the frame section, within the frame section, further comprising;

a plurality of resonating arms extending from the base section with;

long grooves formed along a length direction of a main surface of a resonating arm and including a driving electrode therewithin provided on each of the plurality of resonating arms, wherein wherein a width dimension of each resonating arm has a narrowing width portion in which the width gradually narrows from a base section side toward a tip of a resonating arm and a changing point P of width in which the width dimension extends toward the tip side by an equal dimension or begins to increase between the changing point and the tip of the resonating arm, and with the changing point P positioned closer to the tip of the resonating arm than to a tip of a long groove.

2. The piezoelectric device according to claim 1, wherein the base substrate, the resonator element with a frame, and the lid are all formed from quartz crystal having a same cut angle.

3. The piezoelectric device according to claim 1, wherein a center position of a width dimension of the long groove of each resonator arm is de-centered in a negative X axis direction from a center position of the arm width dimension.

4. The piezoelectric device according to claim 1, wherein the width dimension of each resonating arm includes a first narrowing width portion that suddenly narrows toward the tip of the resonating arm, at a base of the resonating arm to the base section, and a second narrowing width portion that gradually narrows from the end of the first narrowing width portion further toward the tip side of the resonating arm, as the narrowing width portion.

5. The piezoelectric device according to claim 1, wherein the base section includes a cut portion formed with a narrowing in a width direction.

6. The piezoelectric device according to claim 5, wherein the cut portion is formed on the base section separated from the base of each resonator arm by a distance equal to or more than 1.2 times the arm width dimension.

7. The piezoelectric device according to claim 1, wherein a through hole is provided at a position in the base section closer to the resonating arm than is an area at which the frame section is integrally connected to the base section.

8. The piezoelectric device according to claim 1, wherein an irregular-shaped portion projecting toward a positive X axis (electrical axis) direction is formed on a side surface of each resonator arm with a size equal to or less than five micrometers.

* * * * *